(12) United States Patent
Hinata

(10) Patent No.: US 6,850,307 B2
(45) Date of Patent: Feb. 1, 2005

(54) DISPLAY DEVICE SUBSTRATE, METHOD FOR MANUFACTURING THE DISPLAY DEVICE SUBSTRATE, LIQUID-CRYSTAL DISPLAY DEVICE, AND ELECTRONIC EQUIPMENT

(75) Inventor: Shoji Hinata, Matsumoto (JP)

(73) Assignee: Seiko Epson Corporation (JP)

( * ) Notice: Subject to any disclaimer, the term of this patent is extended or adjusted under 35 U.S.C. 154(b) by 127 days.

(21) Appl. No.: 09/785,511

(22) Filed: Feb. 16, 2001

(65) Prior Publication Data

US 2001/0022644 A1 Sep. 20, 2001

(30) Foreign Application Priority Data

Feb. 18, 2000 (JP) ........................................ 2000-041752
Jan. 24, 2001 (JP) ........................................ 2001-016182

(51) Int. Cl.⁷ .......................................... G02F 1/1345
(52) U.S. Cl. ...................................... 349/147; 349/114
(58) Field of Search ................................ 349/113, 114, 349/152, 139, 142, 143, 147, 148

(56) References Cited

U.S. PATENT DOCUMENTS

| | | | | |
|---|---|---|---|---|
| 4,543,573 A | * | 9/1985 | Fuyama et al. ............. | 349/147 |
| 4,688,898 A | * | 8/1987 | Oldendorf et al. ............ | 345/34 |
| 4,689,116 A | * | 8/1987 | Coissard et al. ............ | 438/155 |
| 4,723,838 A | * | 2/1988 | Aoki et al. .................... | 349/47 |
| 4,824,213 A | * | 4/1989 | Morokawa ................... | 349/111 |
| 4,859,036 A | * | 8/1989 | Yamanaka et al. .......... | 349/147 |
| 5,058,996 A | * | 10/1991 | Washizuka et al. ......... | 349/142 |
| 5,083,853 A | * | 1/1992 | Ueki et al. ................... | 349/111 |
| 5,107,355 A | * | 4/1992 | Satoh et al. ................. | 349/147 |
| 5,161,043 A | * | 11/1992 | Narutaki et al. ............. | 349/148 |
| 5,187,604 A | * | 2/1993 | Taniguchi et al. .......... | 349/152 |
| 5,323,252 A | * | 6/1994 | Yoshida et al. ............. | 349/148 |
| 5,367,393 A | * | 11/1994 | Ohara et al. ................. | 349/111 |

FOREIGN PATENT DOCUMENTS

| | | |
|---|---|---|
| JP | 01-197911 | 8/1989 |
| JP | 02-002519 | 1/1990 |
| JP | 02-053031 | 2/1990 |
| JP | 02-281237 | 11/1990 |
| JP | 07-134300 | 5/1995 |
| JP | 07-234420 | 9/1995 |
| JP | 07-333598 | 12/1995 |
| JP | 10-206892 | 8/1998 |
| JP | 11-133454 | 5/1999 |
| JP | 11-223829 | 8/1999 |
| JP | 11-305248 | 11/1999 |
| JP | 11-337981 | 12/1999 |
| WO | WO 99/59024 | 3/1999 |

OTHER PUBLICATIONS

Communication from Chinese Patent Office re: counterpart application.
Examination Result in the corresponding Korean Application.

* cited by examiner

*Primary Examiner*—Kenneth Parker
(74) *Attorney, Agent, or Firm*—Harness, Dickey & Pierce, P.L.C.

(57) ABSTRACT

A panel substrate includes a substrate, a plurality of display electrodes running in parallel on the substrate, and a plurality of wirings respectively continuous from the display electrodes formed on the substrate. The display electrodes and the wirings respectively have a bilayer structure of a transparent conductive layer and a metal layer. The metal layer of the display electrode is substantially narrower in width than the width of the transparent conductive layer.

10 Claims, 22 Drawing Sheets

[FIG. 1]
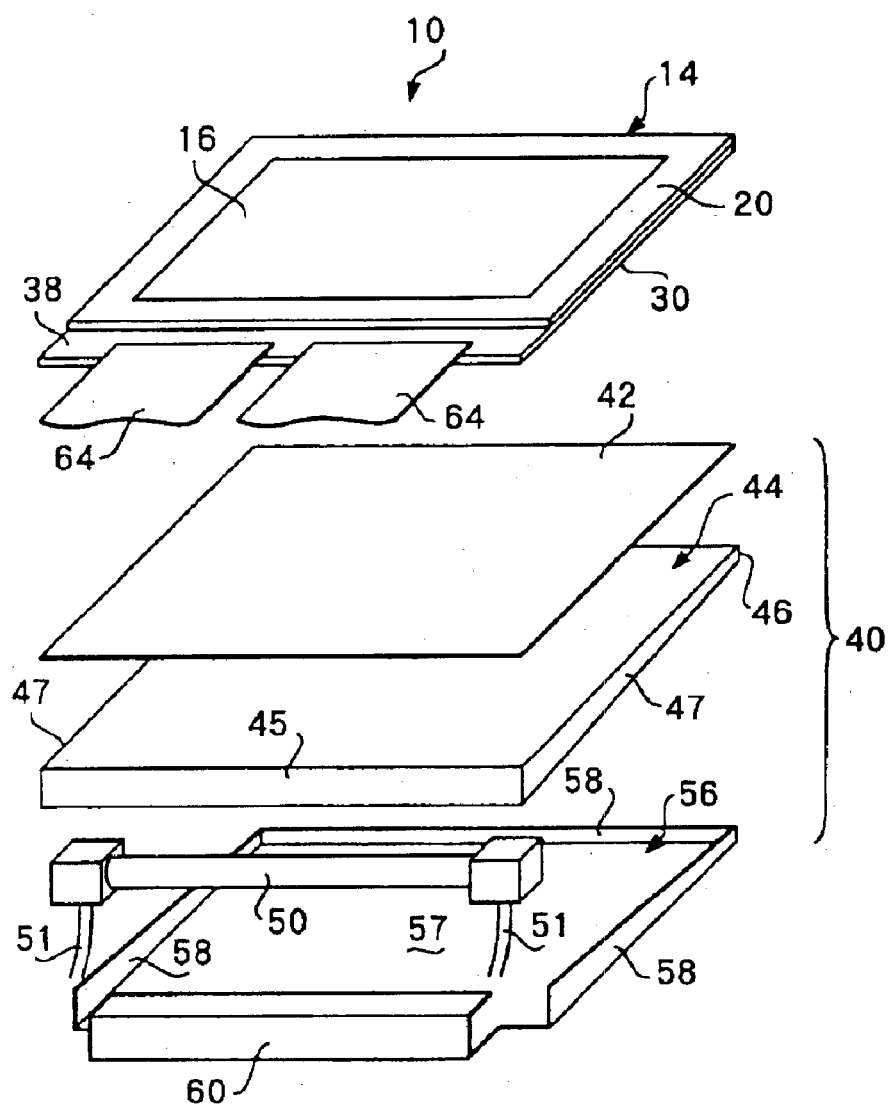

[FIG. 2]
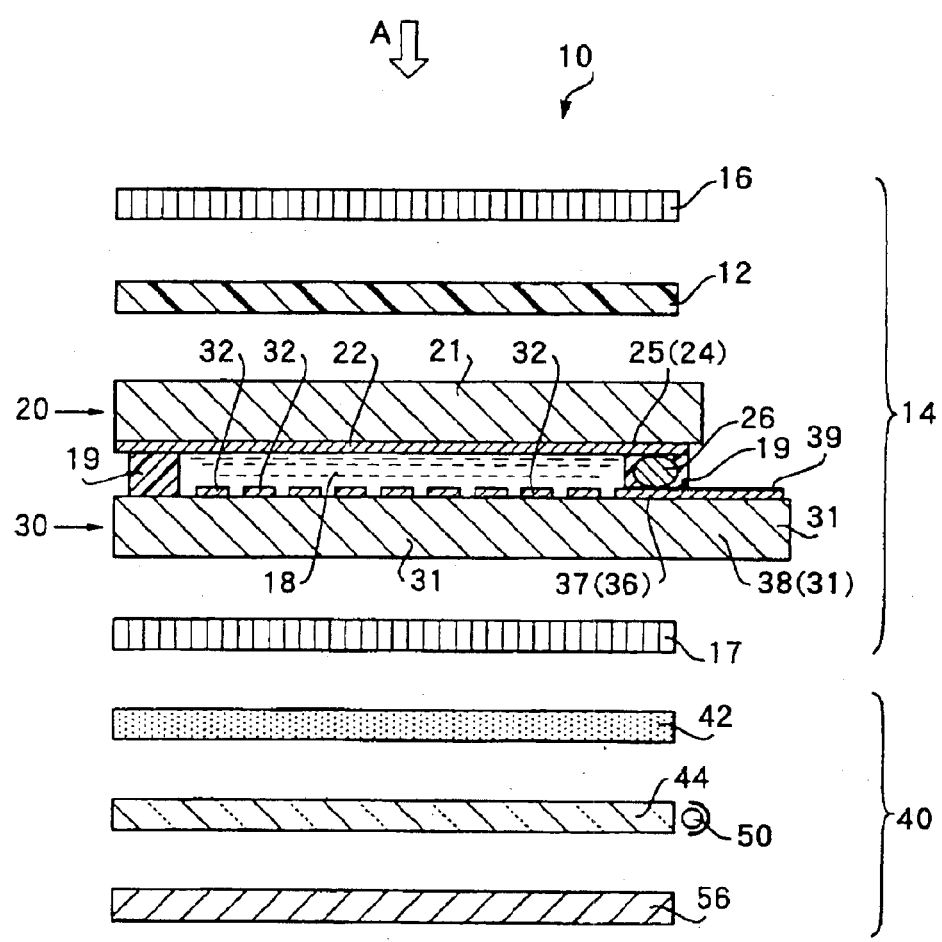

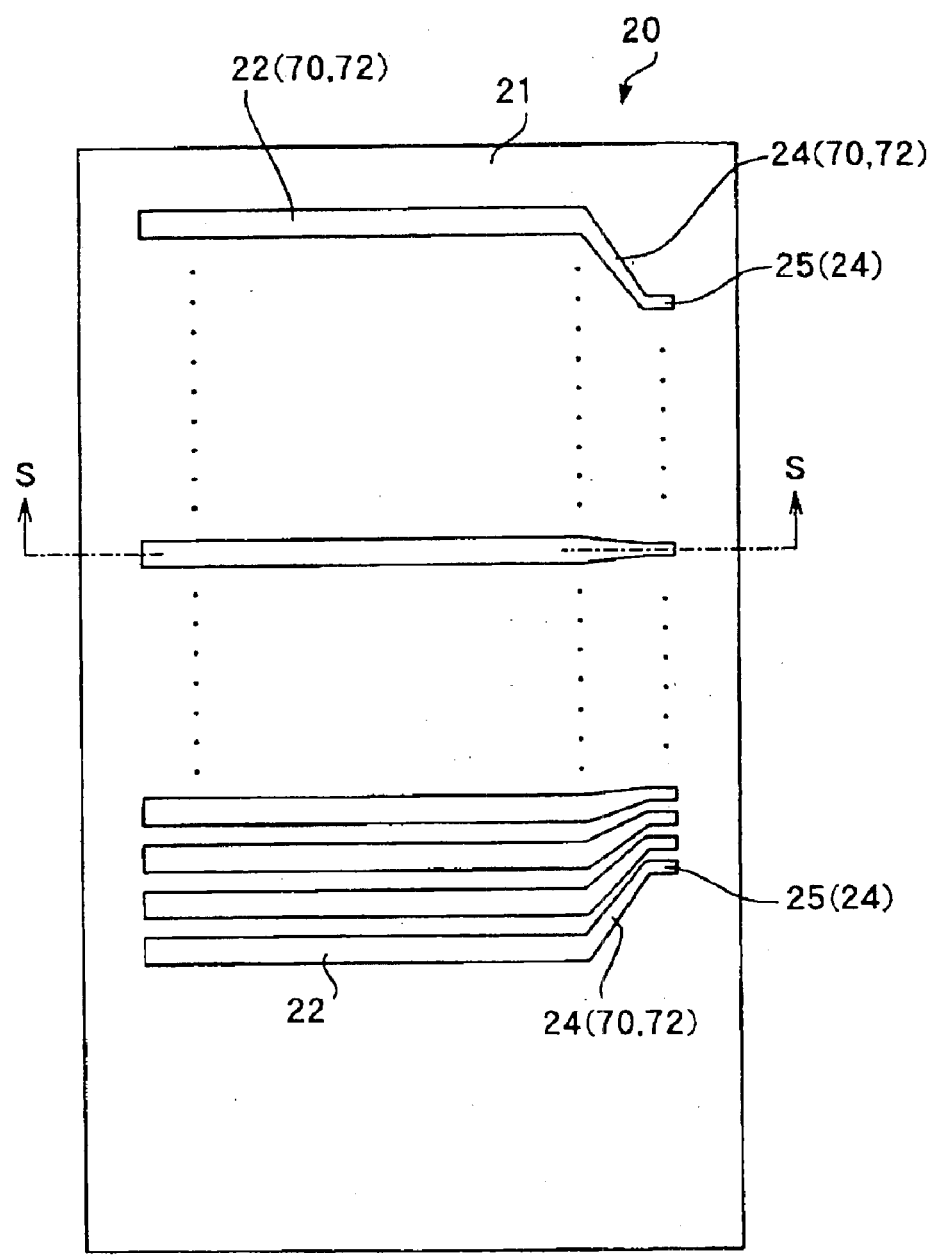
[FIG. 3]

[FIG. 4]
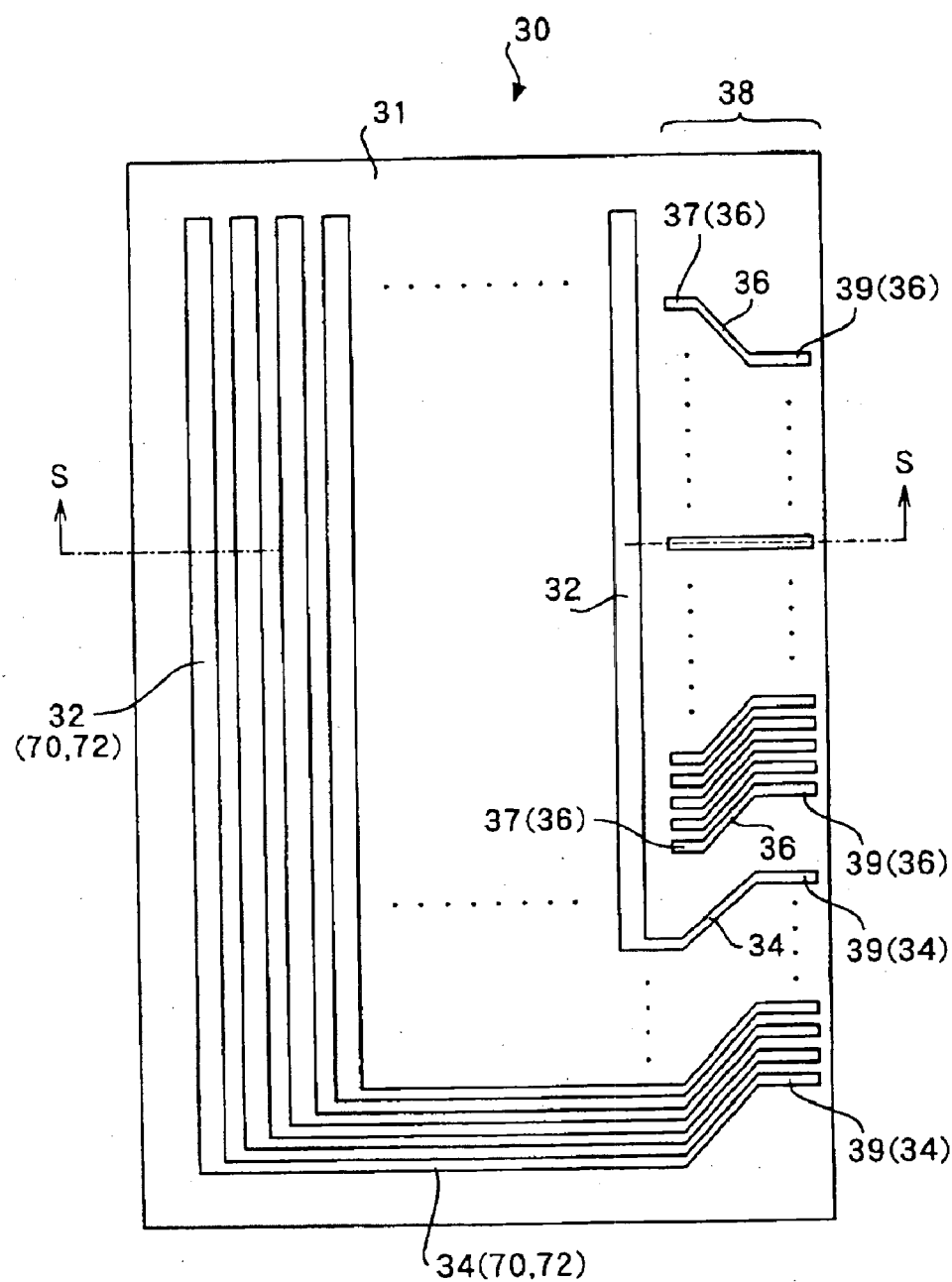

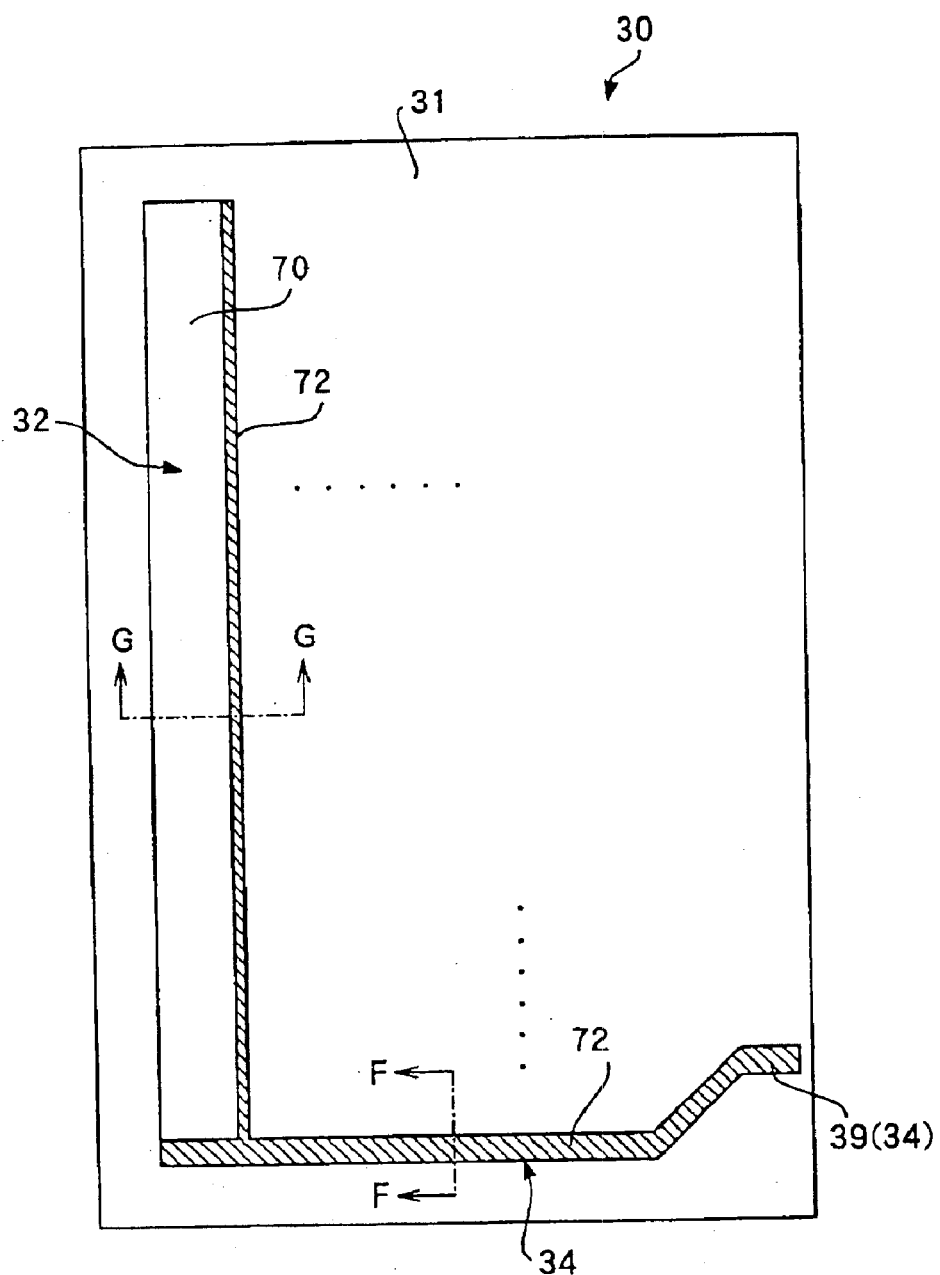
[FIG. 5]

[FIG. 6]
(A)
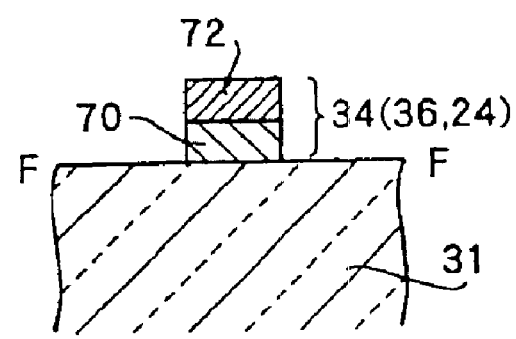
(B)
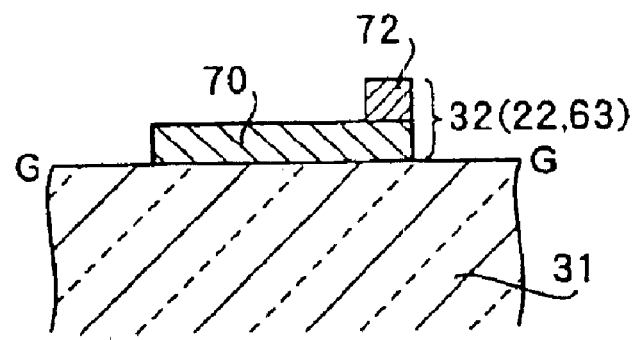

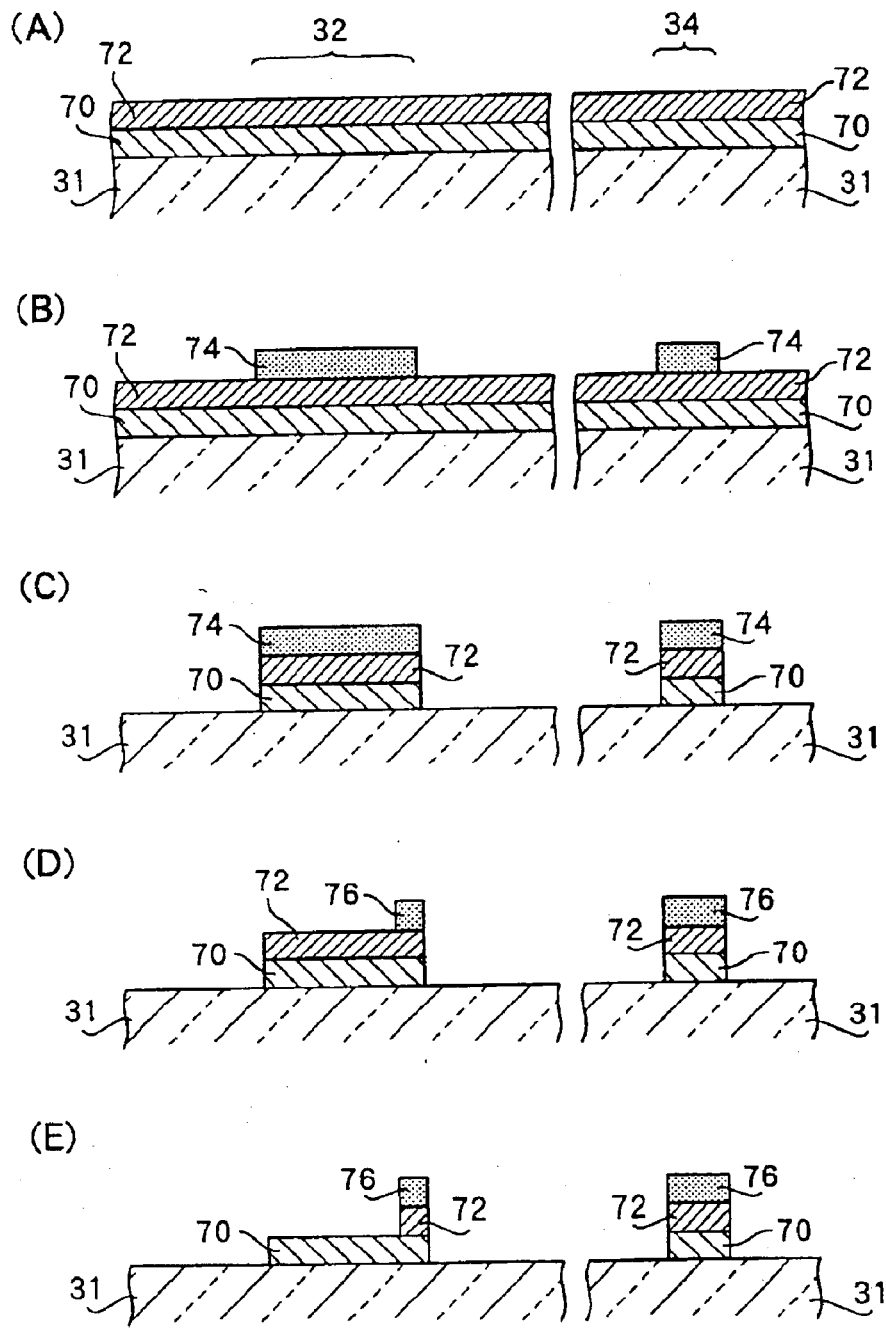
[FIG. 7]

[FIG. 8]
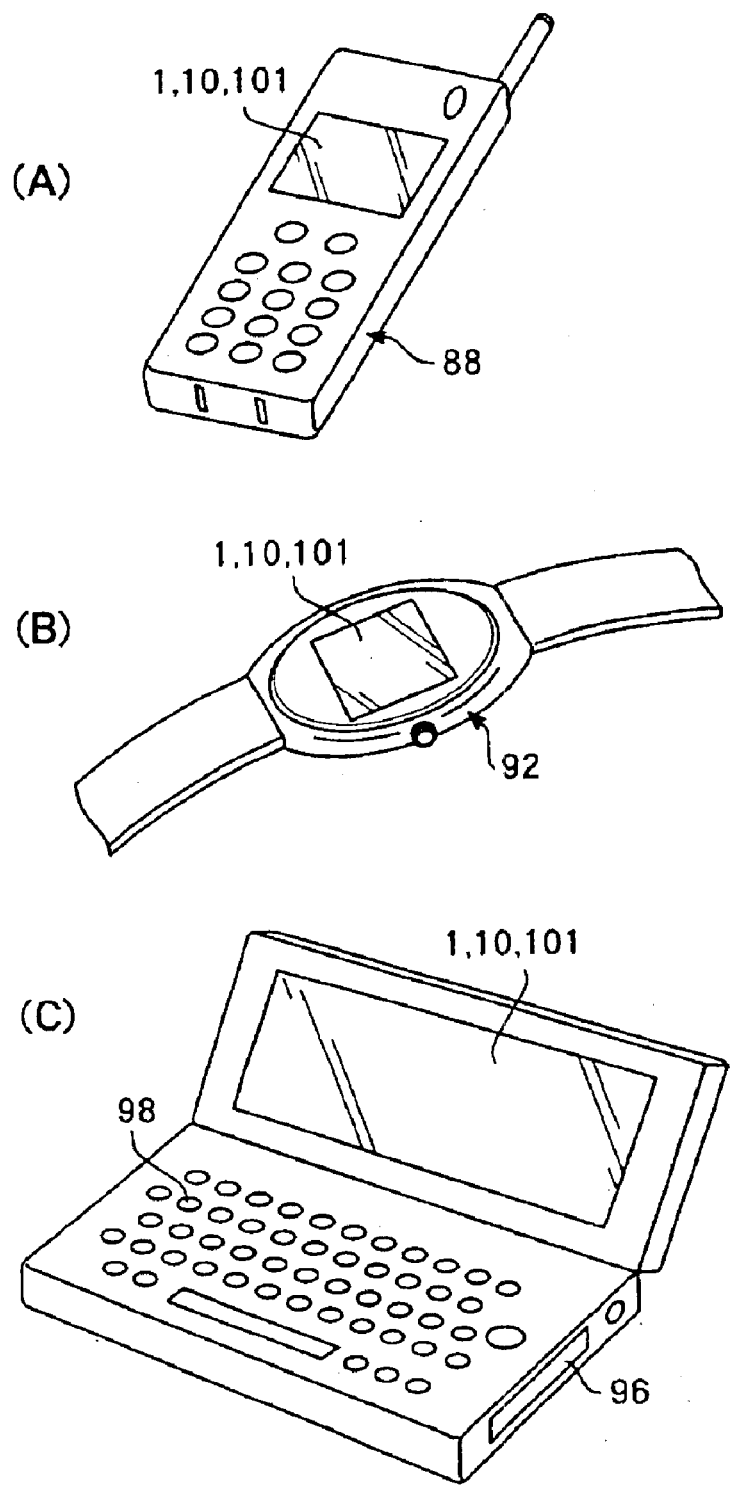

[FIG. 9]
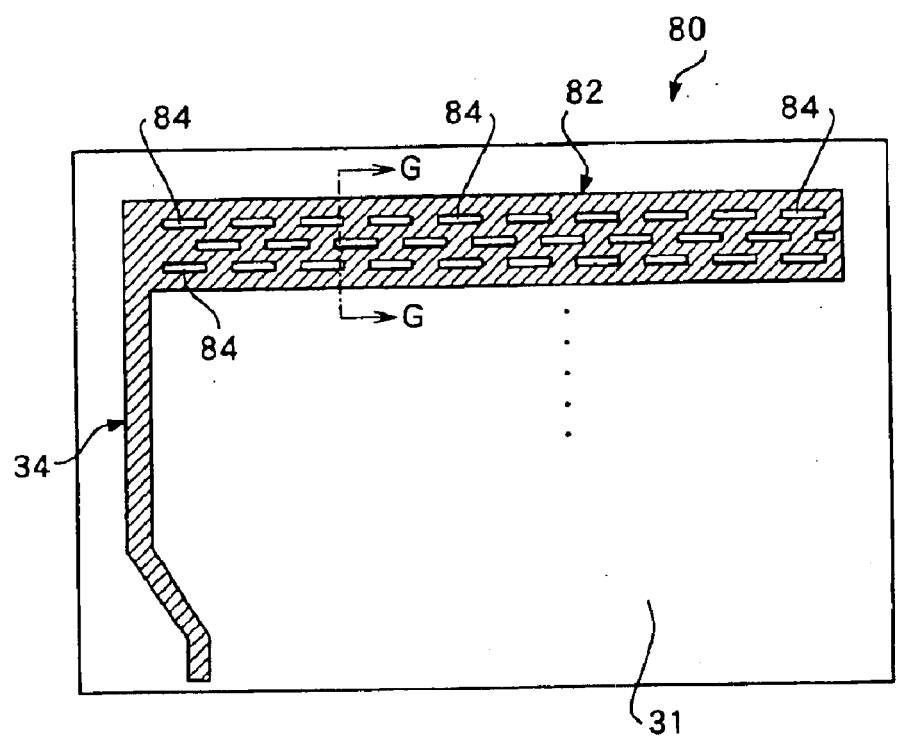

[FIG. 10]
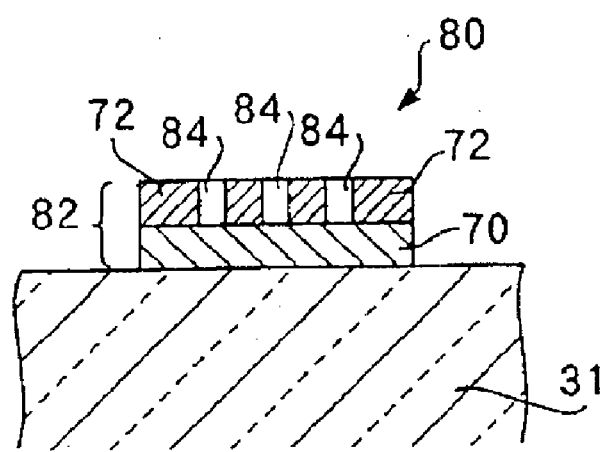

[FIG. 11]
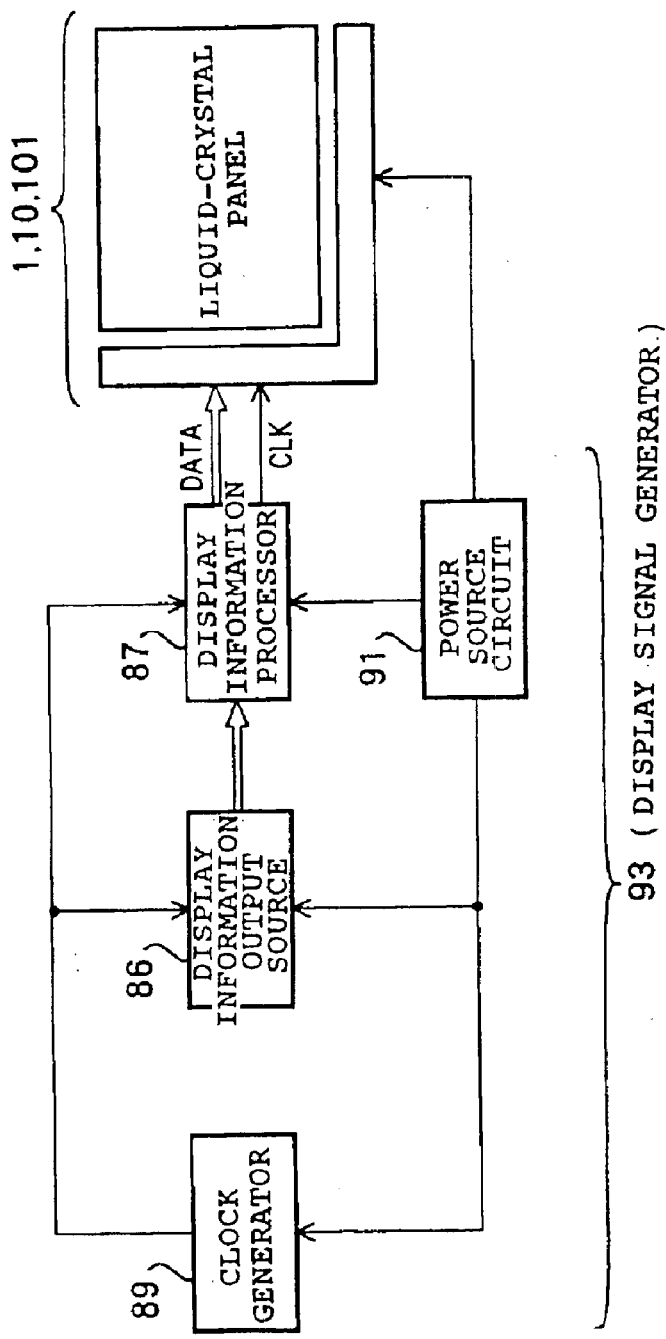

[FIG. 12]
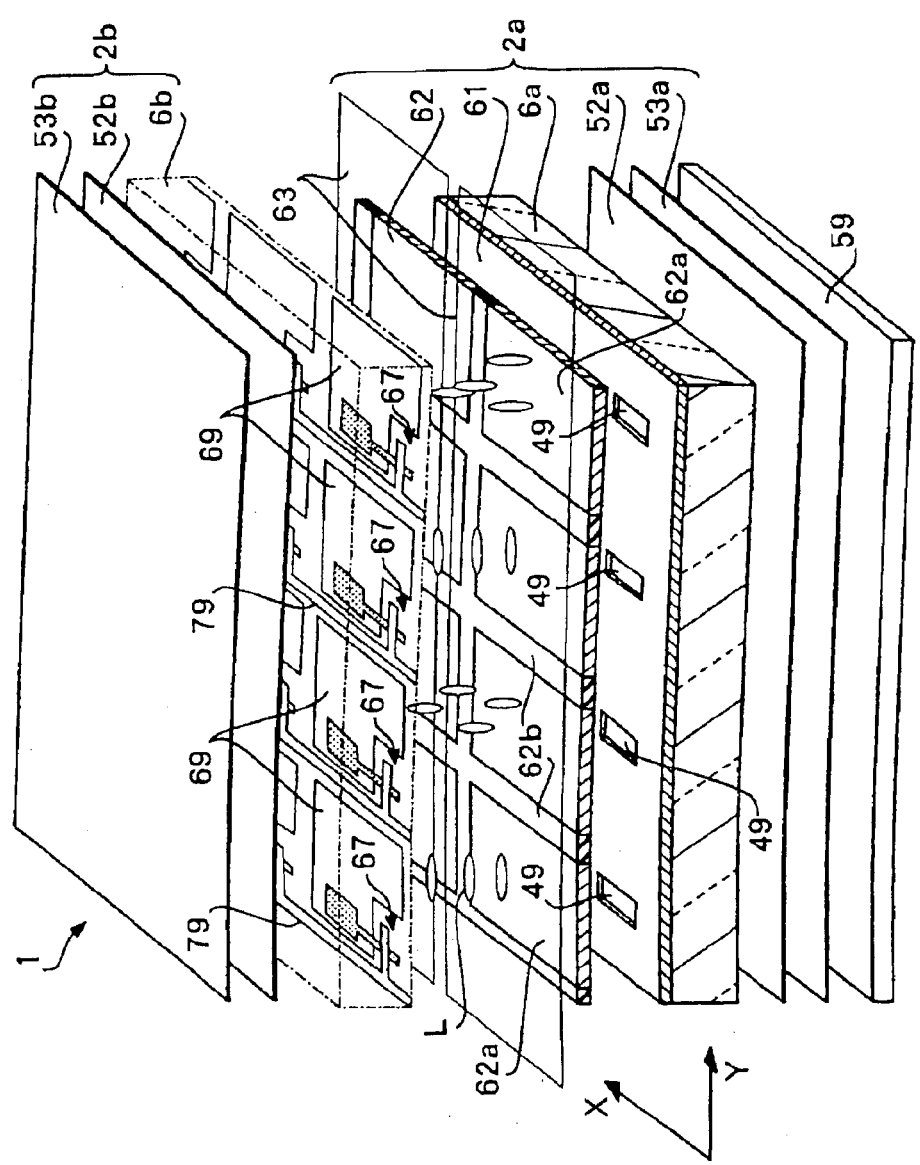

[FIG. 13]
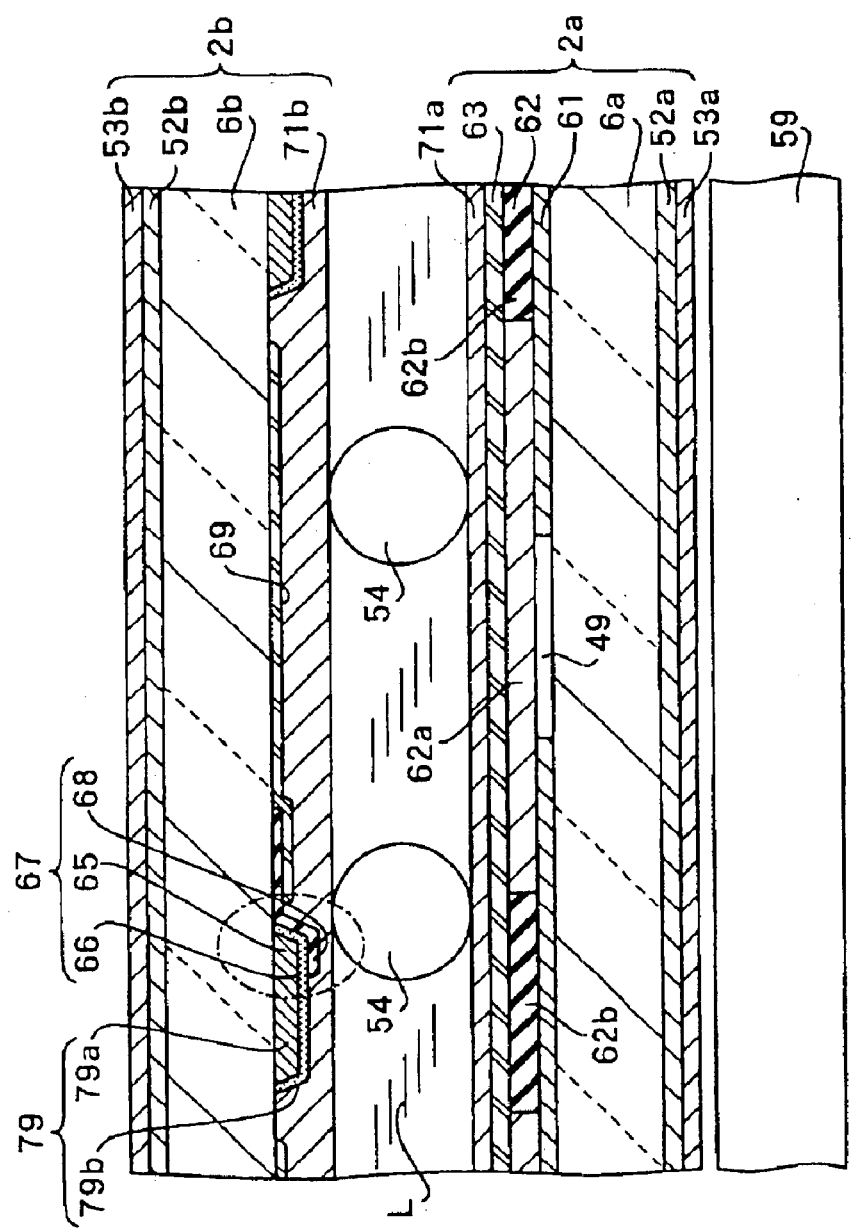

[FIG. 14]
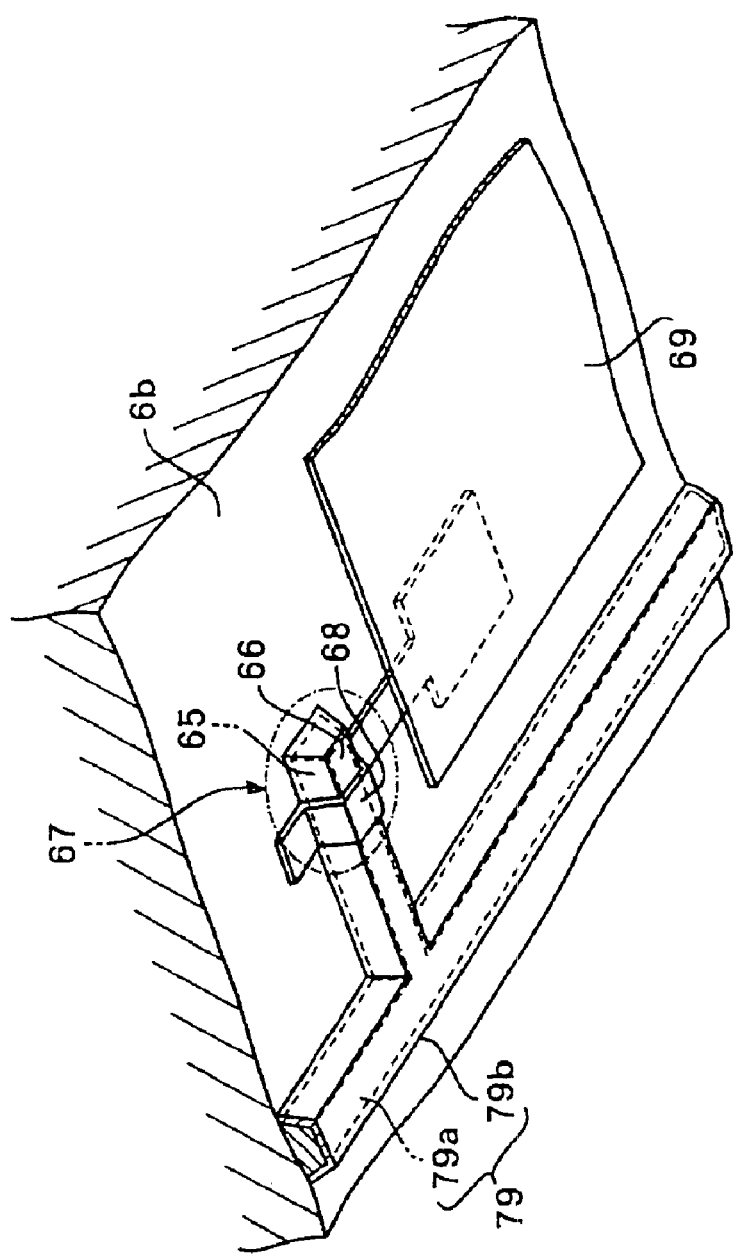

[FIG. 15]
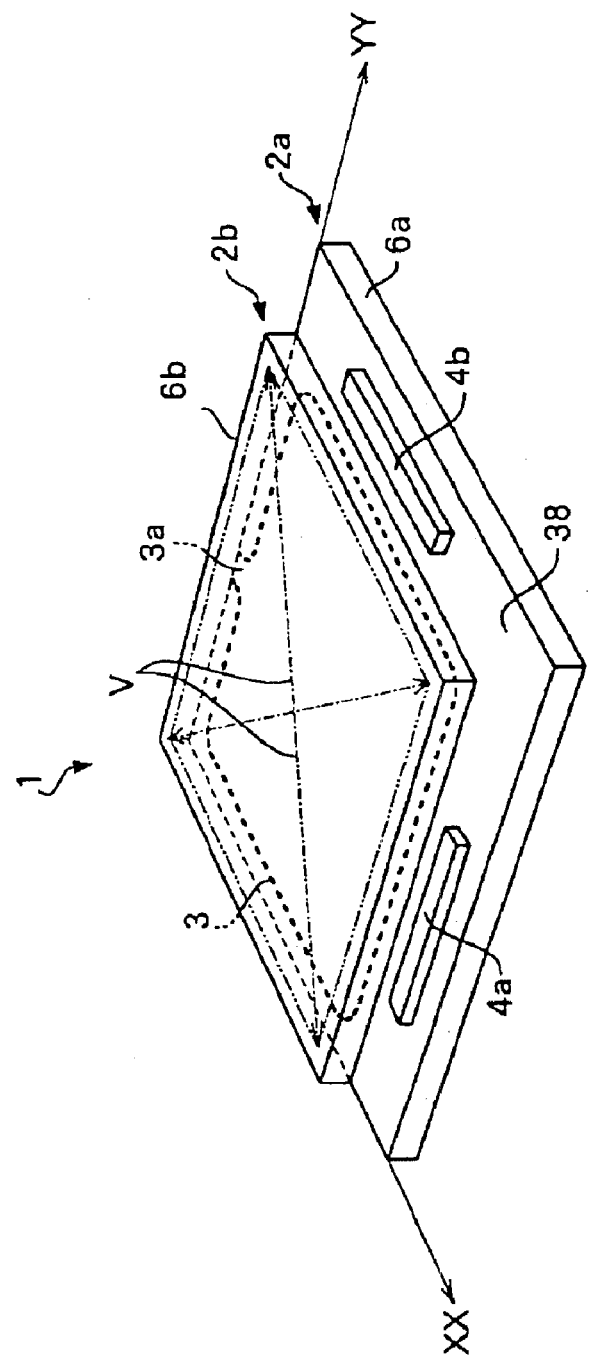

[FIG. 16]
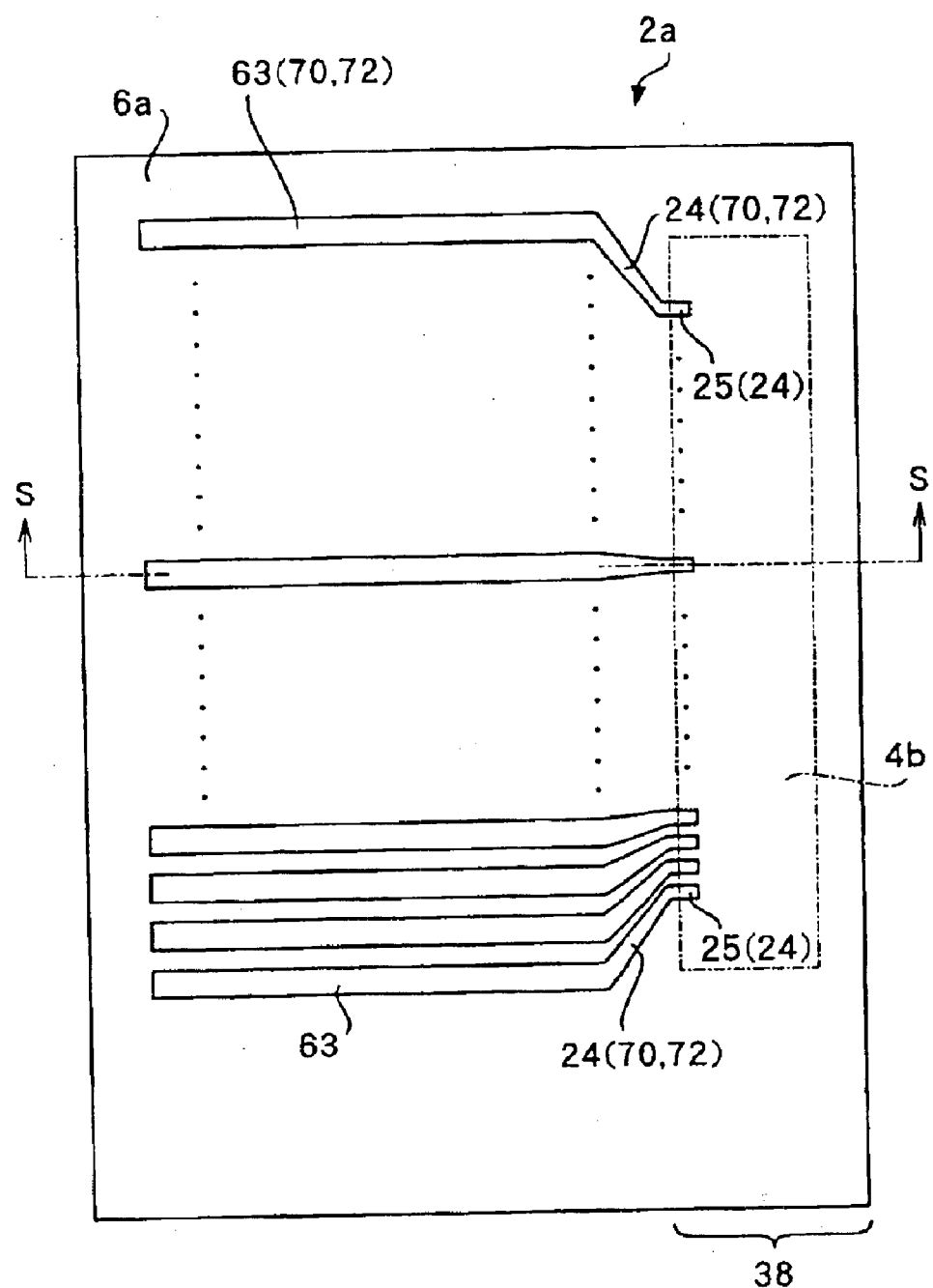

[FIG. 17]
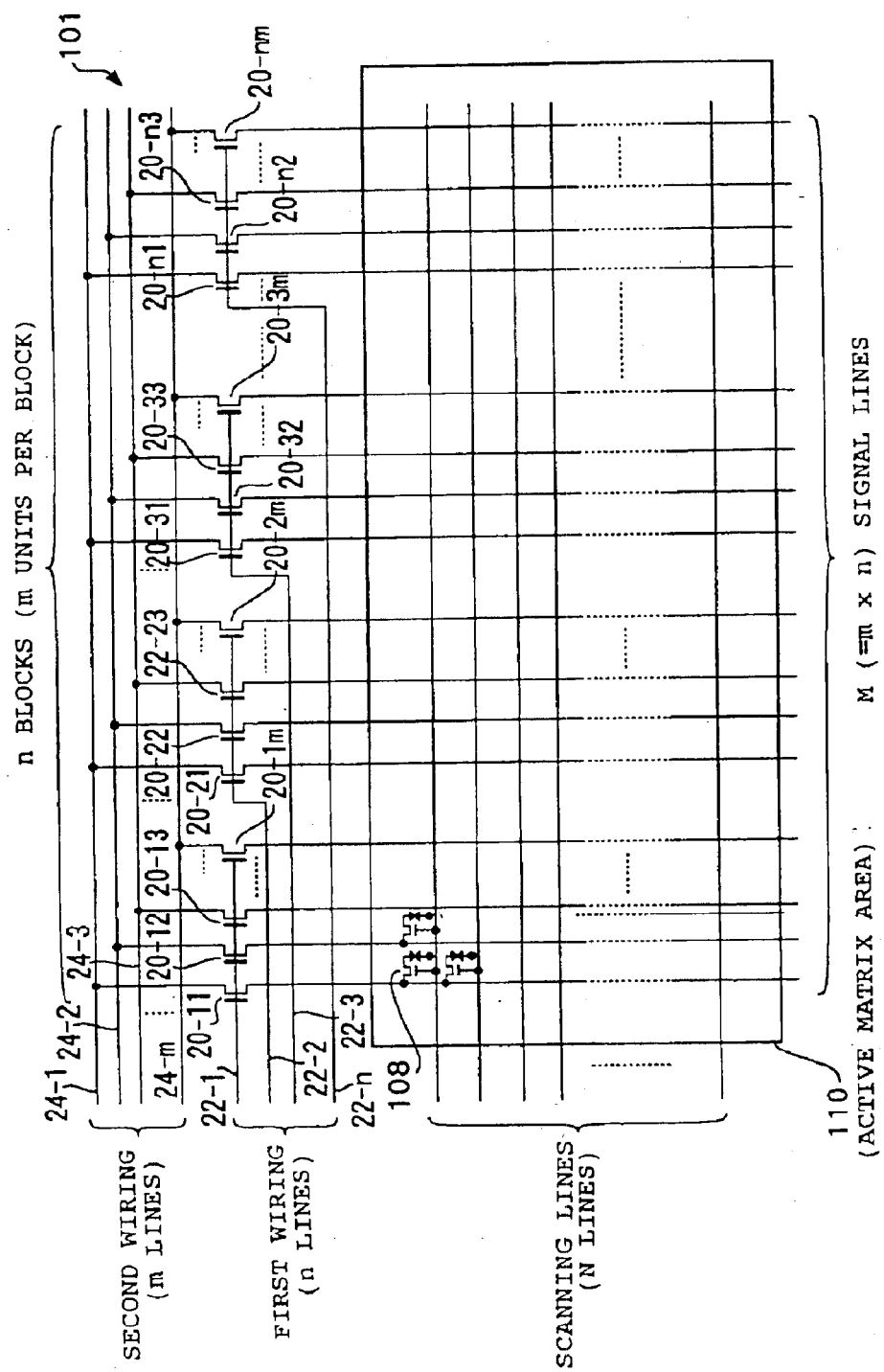

[FIG. 18]
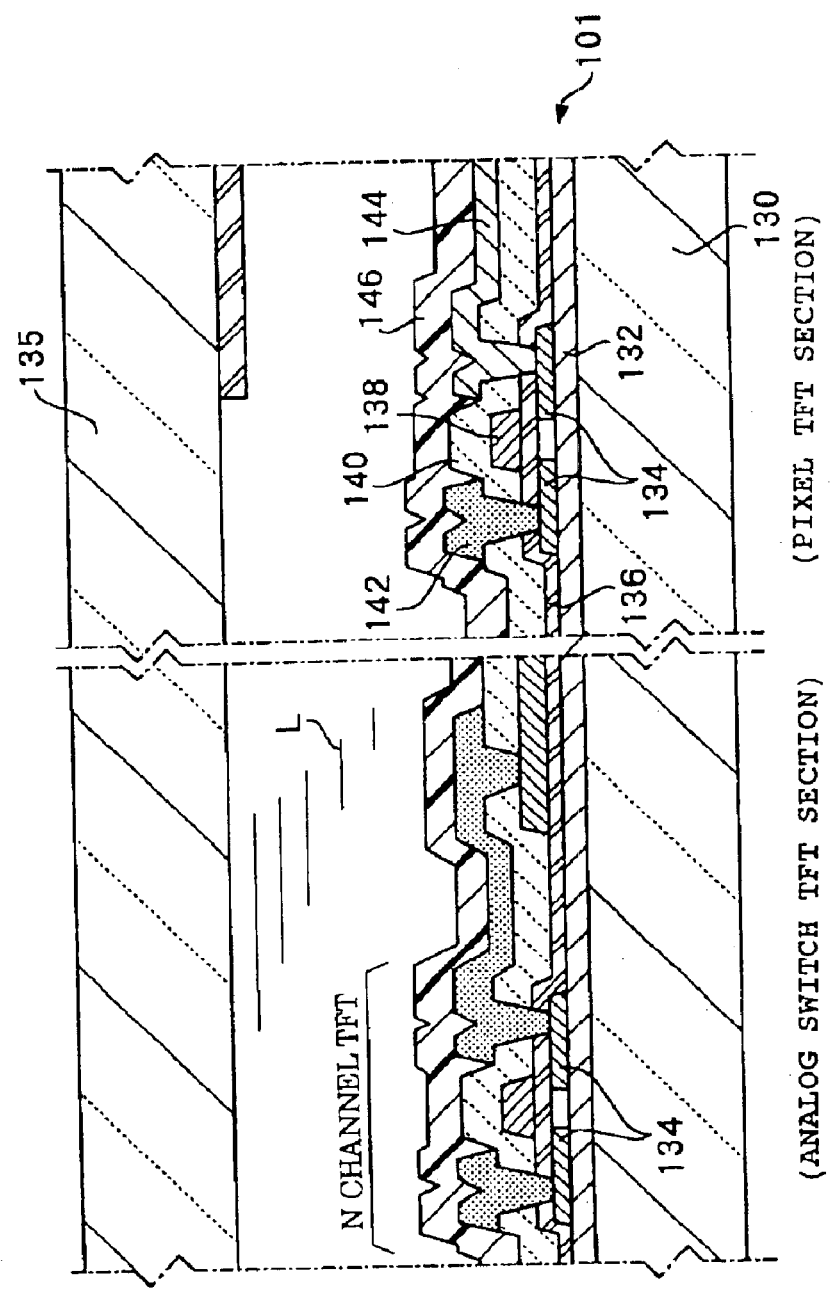

[FIG. 19]
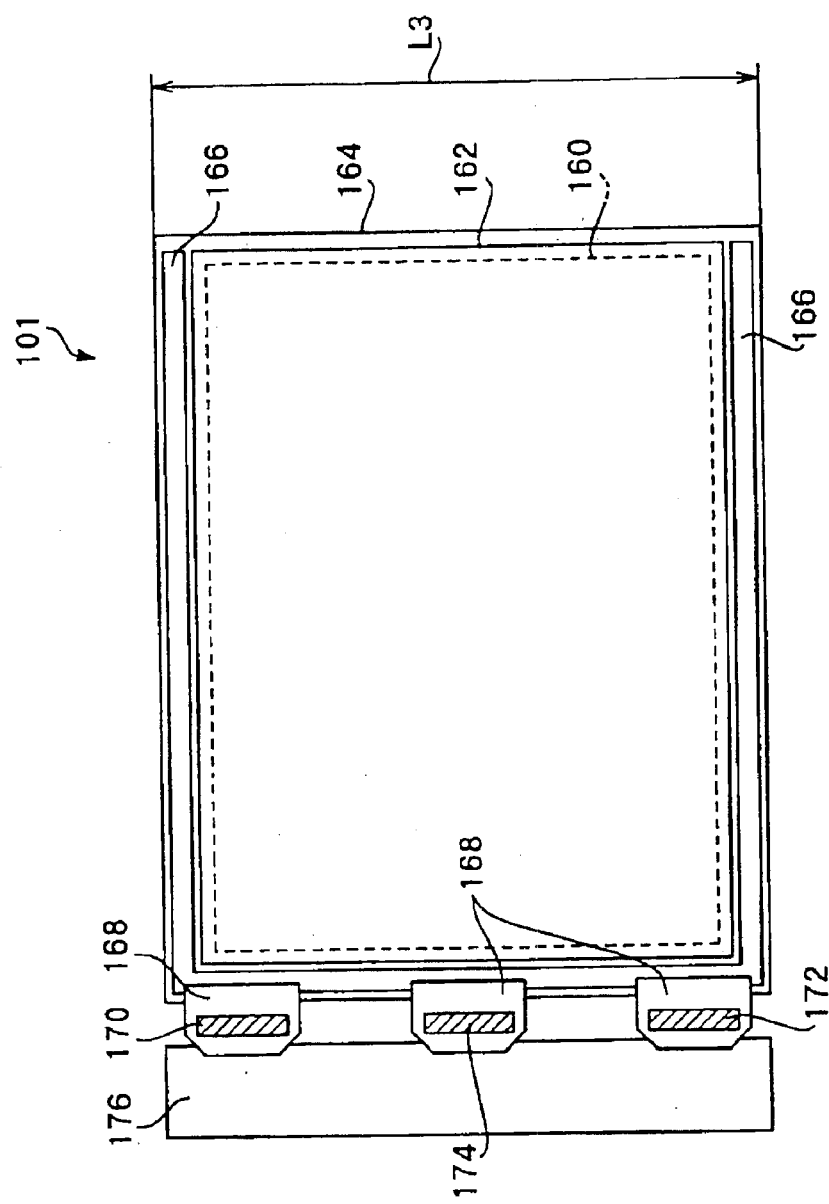

[FIG. 20]
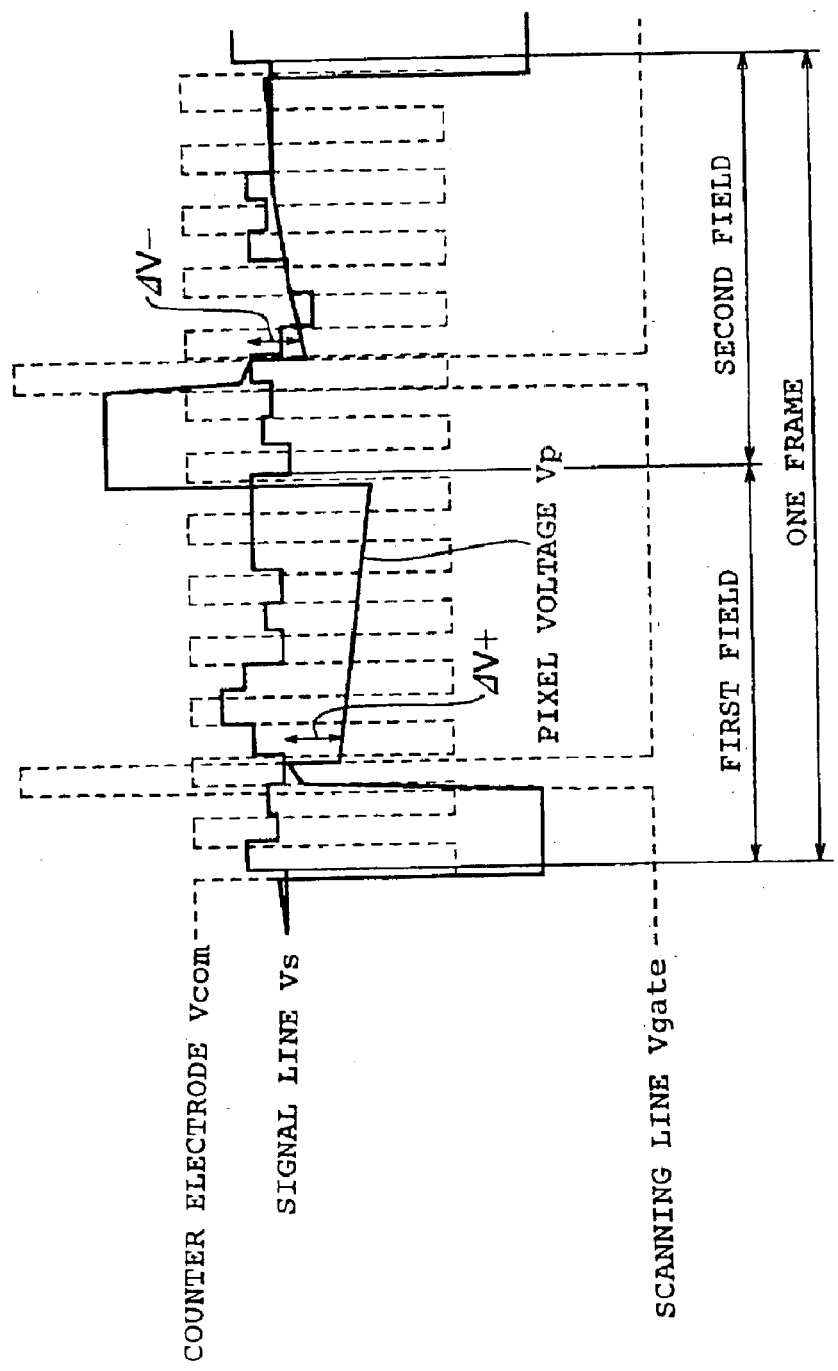

[FIG. 21]
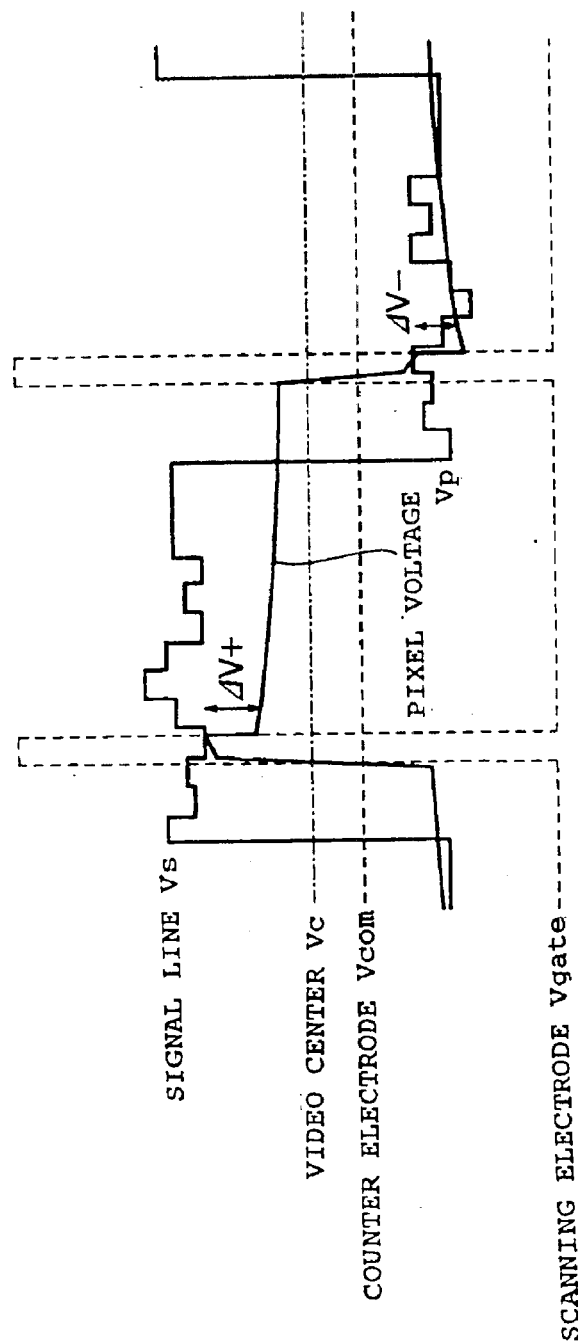

[FIG. 22]
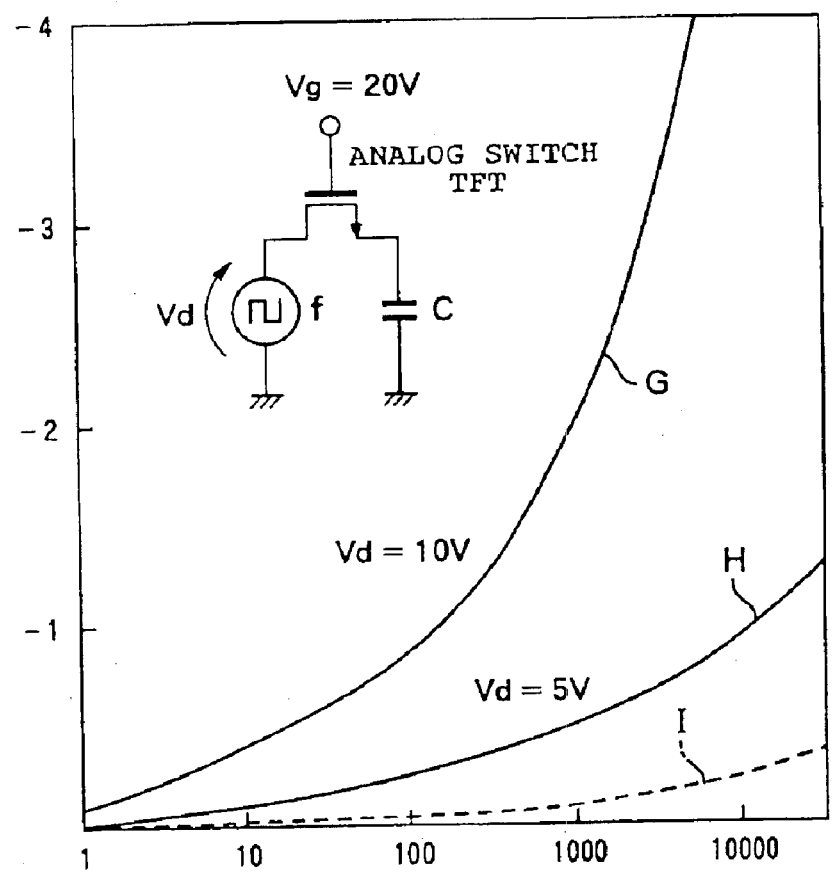

DISPLAY DEVICE SUBSTRATE, METHOD FOR MANUFACTURING THE DISPLAY DEVICE SUBSTRATE, LIQUID-CRYSTAL DISPLAY DEVICE, AND ELECTRONIC EQUIPMENT

BACKGROUND OF THE INVENTION

1. Technical Field of the Invention

The present invention relates to a display device substrate for use in a display device, a manufacturing method for manufacturing the display device substrate, a liquid-crystal display device incorporating the display device substrate, and electronic equipment incorporating the liquid-crystal device.

2. Description of the Related Art

Passive-matrix liquid-crystal devices include two panel substrates, each of which has a plurality of display electrodes running in parallel and wirings electrically connected to the respective display electrodes for applying the display electrodes with voltages. The two panel substrates are assembled to be opposed to each other in a manner such that the two panel substrates form a grating.

Active-matrix liquid-crystal devices having a thin-film diode (TFD) connected to each pixel are constructed by assembling a pair of substrates, i.e., an element substrate, and a counter substrate, in the mutually opposing position thereof. The TFDs, wirings respectively connected to the TFDs, and pixel electrodes serving as display electrodes are arranged on the element substrate. Arranged on the counter substrate is a plurality of display electrodes running in parallel, and wirings electrically connected to the respective display electrodes for applying the display electrodes with voltages. The element substrate and the counter substrate are assembled together in such a manner that the pixel electrodes on the element substrate are opposed in alignment to the display electrodes on the counter substrate.

As the definition of display becomes high, and the outline area surrounding a display area becomes narrow in these conventional liquid-crystal devices, the wirings respectively connected to the display electrodes become fine. As such a fine line design is currently introduced, the resistance of the wiring increases. A drop in the voltage applied from a drive circuit through the wiring is not negligible.

The passive-matrix liquid-crystal devices typically employ an STN (Super Twisted Nematic) liquid crystal. The display of such liquid-crystal display device is susceptible to a subtle variation in the drive voltage. The wiring is electrically connected to the display electrode and is physically continuous from the display electrode, and is fabricated of a transparent conductive film for use as the display electrode, such as an ITO (Indium Tin Oxide) film. The wiring is produced at the same time when the display electrodes are produced. As a result, the display electrode and the wiring thereof are fabricated of the transparent conductive film having substantially the same film thickness.

The wiring has a finer line width to meet compact design requirement. To reduce resistance in the wiring, an increase in the thickness of the transparent conductive film is contemplated. However, as the thickness of the wiring increases, the time required to form the film lengthens. As the wiring increases in thickness, the display electrode, which is concurrently produced, also increases in thickness. This leads to a reduction in the transmittance ratio of the display electrode.

In view of the above problem, the present invention has been developed. The present invention is thus designed to achieve at least one of the three objects of reducing electrical resistance in the wiring, increasing the light transmittance ratio of the display electrode, and shortening the time required to form the display electrode and the wiring.

SUMMARY OF THE INVENTION

A display device substrate includes a plurality of display electrodes, and a plurality of wirings for supplying the plurality of display electrodes with a voltage, wherein the plurality of wirings includes a laminated structure composed of a transparent conductive layer formed of the same layer as that of the display electrodes, and a metal layer fabricated of a metal having an electrical resistance lower than that of the transparent conductive layer.

Since the display device substrate thus constructed has the wirings fabricated of the laminated structure of the transparent conductive layer and the metal layer, the resistance of the wirings is low compared with the case in which the wiring is fabricated of the transparent conductive layer only. The liquid-crystal display device having the display device substrate of this invention suffers less from image quality degradation attributed to a voltage drop in the wirings.

Since this arrangement eliminates the need for thickening the transparent conductive layer for the purpose of reducing the electrical resistance of the wirings, the film thickness of the transparent conductive layer in the display electrode, which is produced typically concurrently with the transparent conductive layer in the wiring, is not excessively increased. The light transmittance ratio of the display electrode becomes higher compared with the case in which the electrical resistance of the wirings is reduced only by thickening the transparent conductive layer.

The transparent conductive layers used in the display electrodes and the wirings become thin, compared with the case in which the electrical resistance of the wirings is reduced only by thickening the transparent conductive layer. The time required to form the display device substrate is thus shortened.

(2) In the display device substrate discussed in paragraph (1), the display electrode may include a laminated structure composed of a transparent conductive layer, and a metal layer fabricated of a metal having an electrical resistance lower than that of the transparent conductive layer.

Since the display electrode has the laminated structure formed of the transparent conductive layer and the metal layer, the electrical resistance of the display electrode becomes lower compared with the case in which the display electrode is fabricated of the transparent conductive layer only. Since lowering the electrical resistance of the display electrode does not involve increasing the thickness of the transparent conductive layer, the light transmittance ratio of the display electrode is increased.

(3) In the display device substrate discussed in paragraph (2), the metal layer in the display electrode is preferably narrower in width than the transparent conductive layer. With this arrangement, the electrical resistance of the display electrode is lowered with almost no drop caused in the brightness level of the display.

(4) In the display device substrate discussed in paragraph (1) or (2), the display electrode preferably includes the laminated structure of the transparent conductive layer and the metal layer, and wherein the metal layer has an aperture partially opened in the laminated structure.

If the display device substrate of the above arrangement is used as a rear substrate of the pair of the substrates forming the liquid-crystal device, the aperture of the display electrode permits light to pass therethrough while the metal layer in the display electrode reflects light therefrom. A transflective liquid-crystal device thus results. Since the display electrode fabricated of the transparent conductive layer is present in the aperture of the metal layer, electric field applied to the liquid crystal in an area corresponding to the aperture is not disturbed.

(5) In the display device substrate discussed in paragraphs (1) through (4), the wirings may be routed from the ends of the respective display electrodes in the peripheral portion of the display device substrate. Since a wiring is typically routed in a frame outline area of a substrate, its length becomes long. The wirings, formed of the laminated structure of the transparent conductive layer and the metal layer in this invention, are particularly advantageous in lowering wiring resistance.

(6) The liquid-crystal display device of the present invention relates to the one which encapsulates a liquid crystal between a pair of substrates, and includes the display device substrate discussed in paragraph (1) through (5) as at least one of the pair of substrates. In the liquid-crystal display device thus constructed, the wirings have the laminated structure of the transparent conductive layer and the metal layer, the electrical resistance of the wirings is rendered lower than when the wirings are formed of the transparent conductive layer only. The liquid-crystal display device having the display device substrate of this invention suffers less from image quality degradation attributed to a voltage drop in the wirings.

Since this arrangement eliminates the need for thickening the transparent conductive layer for the purpose of reducing the electrical resistance of the wirings, the film thickness of the transparent conductive layer in the display electrode, which is produced typically concurrently with the transparent conductive layer for the wiring, is not excessively increased. The light transmittance ratio of the display electrode becomes higher compared with the case in which electrical resistance of the wirings is reduced only by thickening the transparent conductive layer.

The transparent conductive layers of the display electrode and the wirings become thinner compared with the case in which the electrical resistance of the wirings is reduced only by thickening the transparent conductive layer. The time required to form the display device substrate is thus shortened.

(7) The liquid-crystal display device of the present invention, includes the display device substrate discussed in paragraph (4), a counter substrate opposed to the display device substrate, and a liquid-crystal layer encapsulated between the display device substrate and the counter substrate, wherein the liquid-crystal device has a transmissive-type display function using the aperture of the metal layer as a light transmissive section and a reflective-type display function using the region of the metal layer as a light reflective section.

Since in the liquid-crystal device thus constructed, the wirings have the laminated structure of the transparent conductive layer and the metal layer, the electrical resistance of the wirings is rendered low compared with the case in which the wirings are formed of the transparent conductive layer only. The liquid-crystal display device having the display device substrate of this invention suffers less from image quality degradation due to a voltage drop in the wirings.

Since this arrangement eliminates the need for thickening the transparent conductive film for the purpose of reducing the electrical resistance of the wirings, the film thickness of the transparent conductive layer in the display electrode, which is produced typically concurrently with the transparent conductive layer in the wiring, is not excessively increased. The light transmittance ratio of the display electrode becomes high, compared with the case in which the electrical resistance of the wirings is reduced only by thickening the transparent conductive layer.

The transparent conductive layers of the display electrode and the wirings become thin, compared with the case in which electrical resistance of the wirings is reduced only by thickening the transparent conductive layer. The time required to form the transparent conductive layer is thus shortened.

(8) Electronic equipment of the present invention includes the liquid-crystal device discussed in paragraph (6) or (7) as a display means. The electronic equipment provides the above-discussed advantages of the display device. Electronic equipment having display means of a high image quality is provided.

(9) A manufacturing method of the present invention for manufacturing the display device substrate discussed in one of paragraphs (1) through (5), includes a transparent conductive layer fabrication step for fabricating a transparent conductive layer on the display device substrate, a metal layer depositing step for depositing a metal layer on the transparent conductive layer, and an etching step for concurrently etching the transparent conductive layer and the metal layer.

In accordance with the manufacturing method, the transparent conductive layer and the metal layer are laminated, and the laminated structure is then patterned by a single etching process to form a wiring.

(10) A manufacturing method of the present invention for manufacturing the display device substrate discussed in one of paragraphs (1) through (5) includes a transparent conductive layer fabrication step for fabricating a transparent conductive layer on the display device substrate, a metal layer depositing step for depositing a metal layer on the transparent conductive layer, a first etching step for concurrently etching the transparent conductive layer and the metal layer using a first photoresist film, and a second etching step for etching the metal layer only using a second photoresist film, wherein the second photoresist film having a predetermined pattern is created by subjecting the first photoresist film to exposure and development processes.

In accordance with this manufacturing method, the second etching step uses the second photoresist film that is obtained by subjecting the first photoresist film, having a predetermined pattern and used in the first etching step, to the exposure and development processes. Through the second etching step, the metal layer becoming a display electrode is etched away with part thereof being left. The photoresist is then removed. The pattern of the display electrode and the wirings is thus formed of a portion where both the transparent conductive layer and the metal layer are laminated and a portion where the transparent conductive layer only is present.

In accordance with the manufacturing method, the application and then the removal of the photoresist film are respectively performed only one time, resulting in a pattern where the metal layer and the transparent conductive layer are laminated. This manufacturing method results in a substantial decrease in manufacturing steps in comparison to a conventional manufacturing method in which the transparent conductive layer and the metal layer are separately patterned. In the conventional manufacturing method, each of the application and removal of the photoresist twice must respectively be performed twice. The transparent conductive layer and the metal layer are laminated, and the resulting laminated structure is subjected to a single etching step for patterning to produce the wiring.

(11) In a manufacturing method for manufacturing a display device substrate discussed in paragraph (10), the metal layer in the display electrode may be etched through the second etching step so that the metal layer is left on only the edge portion of the transparent conductive layer. In accordance with this manufacturing method, the display electrode having a low electrical resistance is patterned with substantially reduced number of steps with almost no drop involved in the brightness level of the display.

(12) In the manufacturing method for manufacturing a display device substrate discussed in paragraph (10), the metal layer in the display electrode may be etched through the second etching step so that the metal layer has an aperture on the transparent conductive layer. In accordance with the manufacturing method, the display device substrate having the advantages discussed in paragraph (4) is produced with a smaller number of manufacturing steps involved.

(13) A liquid-crystal device of the present invention includes a pair of display device substrates, and a liquid crystal encapsulated between the display device substrates, wherein one of the pair of display device substrates includes a plurality of pixel electrodes, and a plurality of two-terminal-type switching elements, each connected to the respective pixel electrode, the other of the pair of display device substrates includes a plurality of display electrodes arranged in stripes to be opposed to the plurality of pixel electrodes, and wirings respectively connected to the display electrodes, the plurality of display electrodes includes a transparent conductive layer, and the wirings include a transparent conductive layer formed of the same layer as that of the display electrodes, and a metal layer fabricated of a metal having an electrical resistance lower than that of the transparent conductive layer. The two-terminal switching element here may be a TFD (Thin Film Diode).

(14) A liquid-crystal device of the present invention includes a pair of display substrates, and a liquid crystal encapsulated between the display device substrates, wherein one of the pair of display device substrates includes a plurality of pixel electrodes, and a plurality of three-terminal-type switching elements, each connected to the respective pixel electrode, the other of the pair of display device substrates includes a plurality of display electrodes arranged in stripes to be opposed to the plurality of pixel electrodes, and wirings respectively connected to the display electrodes, the plurality of display electrodes includes a transparent conductive layer, and the wirings include a transparent conductive layer formed of the same layer as that of the display electrodes, and a metal layer fabricated of a metal having an electrical resistance lower than that of the transparent conductive layer. The three-terminal switching element may be a TFT (Thin-Film Transistor).

BRIEF DESCRIPTION OF THE DRAWINGS

FIG. 1 is an exploded perspective view showing one embodiment of the liquid-crystal device of the present invention.

FIG. 2 is an exploded cross-sectional view showing the construction of the liquid-crystal device of FIG. 1.

FIG. 3 is a plan view showing one of panel substrates forming the liquid-crystal device of FIG. 1.

FIG. 4 is a plan view showing the other panel substrate forming the liquid-crystal device of FIG. 1.

FIG. 5 is a plan view showing, in enlargement, a single display electrode and a wiring of the panel substrate of FIG. 4.

FIG. 6(A) is a cross-sectional view showing the wiring taken along line F—F in FIG. 5, and FIG. 6(B) is a cross-sectional view showing the display electrode taken along line G—G in FIG. 5.

FIGS. 7(A)–7(E) are cross-sectional views partially showing the panel substrate in the manufacturing process of the panel substrates.

FIGS. 8(A)–8(C) show embodiments of the electronic equipment of the present invention, wherein FIG. 8(A) shows a mobile telephone, FIG. 8(B) shows a wristwatch, and FIG. 8(C) shows a mobile information terminal.

FIG. 9 is a plan view showing a modification of the single display electrode and its associated wiring of the panel substrate shown in FIG. 4.

FIG. 10 is a cross-sectional view showing the display electrode taken along line G—G in FIG. 9.

FIG. 11 is a block diagram showing an electrical control system of the electronic equipment.

FIG. 12 is an exploded perspective view showing a major portion of another embodiment of the liquid-crystal device of the present invention.

FIG. 13 is a cross-sectional view showing a major portion of the liquid-crystal device in FIG. 12.

FIG. 14 is a perspective view showing a single TFD used in the liquid-crystal device of FIG. 12.

FIG. 15 is a perspective view showing the external appearance of the liquid-crystal device of FIG. 12.

FIG. 16 is a plan view showing one of display device substrates forming the liquid-crystal device of FIG. 12.

FIG. 17 is a circuit diagram showing a circuit arrangement of yet another embodiment of the liquid-crystal device of the present invention.

FIG. 18 is a cross-sectional view showing a major portion of the liquid-crystal device of FIG. 17.

FIG. 19 is a plan view showing the external appearance of the liquid-crystal device of FIG. 17.

FIG. 20 is a drive voltage waveform diagram showing a bias voltage swing drive method as a drive method for the liquid-crystal device of FIG. 17.

FIG. 21 is a drive voltage waveform diagram showing a field polarity reversal drive method which is a typical drive method for use in active-matrix TFT liquid-crystal devices.

FIG. 22 is a graph plotting measurement results for verifying the relationship between a shift amount of a threshold voltage and operating time.

DETAILED DESCRIPTION OF THE PREFERRED EMBODIMENTS

The preferred embodiments of the present invention are specifically discussed, referring to the drawings.

FIG. 1 is an exploded perspective view diagrammatically showing a liquid-crystal device 10 as a display device of the present invention. FIG. 2 is a cross-sectional view diagrammatically showing the liquid-crystal device 10 of FIG. 1. As shown, the liquid-crystal device 10 includes a liquid-crystal panel 14 as a display panel, and a backlight unit 40 having a light guide plate 44 arranged behind the liquid-crystal panel 14. The liquid-crystal device 10 also includes a bracket member (not shown) for protecting and keeping the liquid-crystal panel 14 and the backlight unit 40 in position.

Referring to FIG. 2, the liquid-crystal panel 14 is constructed by arranging a first panel substrate 20 and a second panel substrate 30 in an opposing position. Spacers (not shown) are dispersed between the first panel substrate 20 and the second panel substrate 30 to keep the two substrates apart by a predetermined gap therebetween. The first panel substrate 20 is a display device substrate that is produced by forming striped display electrodes 22 on one side of a substrate 21 fabricated of a transparent material such as glass or synthetic resin.

The second panel substrate 30 works as a display device substrate that is produced by forming striped display electrodes 32 on one side of a substrate 31 fabricated of a transparent material such as glass or synthetic resin. The display electrodes 22 of the first panel substrate 20 and the display electrodes 32 of the second panel substrate 30 are arranged to be opposed to each other in a manner such that a grating configuration is formed. A so-called passive-matrix liquid-crystal panel results.

A sealing member 19 is inserted between the pair of substrates 20 and 30 in the peripheral outline thereof in a substantially rectangular configuration when viewed from an arrow A as shown in FIG. 2. The two panel substrates 20 and 30 are glued onto each other with the sealing member 19. Conductive members 26 of particles are included in the sealing member 19, thereby electrically connecting wirings 36 on the second panel substrate 30 to wirings 24 leading to the display electrodes 22 on the first panel substrate 20 via the conductive members 26. In this way, voltages input to terminals 39 are applied to the display electrodes 22.

A liquid crystal, for example, a liquid crystal 18 of an STN type, is introduced into the gap between the first panel substrate 20 and the second panel substrate 30 and enclosed by the sealing member 19, through a liquid crystal injection port (not shown) arranged in the sealing member 19. The liquid-crystal injection port is then closed by a seal material (now shown) after a liquid-crystal injection process.

A first polarizer 16 is mounted on the external side of the first panel substrate 20, while the second polarizer 17 is mounted on the external side of the second panel substrate 30. A retardation film 12 is arranged between the first polarizer 16 and the first panel substrate 20. Alternatively, a retardation film 12 may be arranged between the second polarizer 17 and the second panel substrate 30. It is also acceptable that retardation films 12 are respectively arranged external to both the first panel substrate 20 and the second panel substrate 30.

The liquid-crystal panel 14 is provided with a plurality of terminals 39 on an overextension 38 of the second panel substrate 30 extending over from the edge of the first panel substrate 20. Connected to the terminals 39 are terminals of wiring boards 64 shown in FIG. 1, such as flexible boards. The wiring boards 64 bear drive ICs (not shown) for driving the display electrodes 22 and 32 (see FIG. 2) on the liquid-crystal panel 14. The terminals of the wiring boards 64 connected to the output terminals of the drive ICs are respectively connected the terminals 39 formed on the second panel substrate 30, thereby feeding drive voltages to the display electrodes 22 and 23.

In the liquid-crystal panel 14, the liquid crystal 18 is applied with a voltage difference between signals supplied to each of the plurality of display electrodes 22 formed on the first panel substrate 20 and supplied to each of the plurality of display electrodes 32 formed on the second panel substrate 30. The alignment of liquid-crystal molecules is thus controlled to turn on or turn off displaying.

Alternatively, the first panel substrate 20 or the second panel substrate 30 may be provided with a mount area for accommodating the drive ICs. The drive ICs are thus mounted on the first panel substrate 20 or the second panel substrate 30 using the COG (Chip On Glass) technology. In this case, the signals and voltages are supplied to the drive ICs on the panel substrate through flexible boards.

Referring to FIG. 2, the pair of panel substrates 20 and 30 are shown widely separated for clarifying the details. In practice, the pair of panels 20 and 30 are spaced by a small gap as narrow as several $\mu$m to dozens of $\mu$m. Referring to FIG. 20, the first polarizer 16 and the retardation film 12 are shown separated from the first panel substrate 20, and the second polarizer 17 is shown separated from the second panel substrate 30. In practice, however, the retardation film 12 is almost in contact with the first panel substrate 20, the second polarizer 17 is almost in contact with the second panel substrate 30, and the first polarizer 16 is almost in contact with the retardation film 12. Although several striped display electrodes 22 and 23 are shown, there are employed a large number of striped electrodes, the number of which is dependent on the resolution requirement of the matrix display in practice.

Referring to FIG. 1, the backlight unit 40 includes a fluorescent tube 50 as a light source, the light guide plate 44, a lens sheet 42 as a light diffusing plate, a backlight support bracket 56, and a reflector 60. The fluorescent tube 50 is connected to an output terminal of an inverter (not shown) through a connector assembly 51. The inverter supplies the fluorescent tube 50 with a predetermined voltage.

The light guide plate 44 is fabricated of a transparent synthetic resin, for example. The fluorescent tube 50 as a light source is placed substantially in contact with an end face 45 of the light guide plate 44. Light from the fluorescent tube 50 enters through the end face 45 into and travels the light guide plate 44, and exits from the light exit surface of the light guide plate 44 facing the liquid-crystal panel 14. The light then illuminates the entire display area of the liquid-crystal panel 14. The light guide plate 44 has a flat surface area substantially coextending with the flat surface of the liquid-crystal panel 14 except for the overextension 38 of the liquid-crystal panel 14.

The light guide plate 44 is tapered from the thickest portion thereof at the fluorescent tube 50 to be gradually thinner at it goes away in a wedge-like cross section. With the light guide plate 44 configured in this way, the quantity of light radiated toward the liquid-crystal panel 14 from the light guide plate 44 is made uniform, for example, with no difference in light intensity between at a point in the vicinity of the fluorescent tube 50 and the farthest point away from the fluorescent tube 50.

The lens sheet 42, arranged in front of the light guide plate 44, diffuses light emitted from the light guide plate 44, thereby illuminating the entire display area of the liquid-crystal panel 14 with uniform light. The reflector 60 surrounds the fluorescent tube 50 except the side thereof facing the light guide plate 44 so that light from the fluorescent tube 50 is reflected toward the light guide plate 44. Referring to FIG. 1, the fluorescent tube 50, shown external to the reflector 60, is actually housed in the reflector 60.

The fluorescent tube 50 of the backlight unit 40 is supplied with power from the unshown inverter. In response to a direct-current voltage of 5 V, the inverter outputs a 250 V, 100 kHz alternating-current voltage to the fluorescent tube 50. Instead of the fluorescent tube 50, an LED may be used as a light source. The LED may be arranged alongside the light guide plate 44.

The backlight support bracket 56, having a bottom portion 57, supports the backlight unit 40 from the backside thereof. The backlight support bracket 56 also has a plurality of guide portions 58 vertically extending from the bottom portion 57 thereof for aligning the backlight unit 40. The guide portions 58 are respectively shaped to receive the end faces 46 and 47 of the light guide plate 44, and are in abutment with the end faces 46 and 47 of the light guide plate 44. In this way, the light guide plate 44 is in substantially parallel alignment with the surface of the bottom portion 57.

Except for the side facing the fluorescent tube 50, the backlight support bracket 56 has the guide portions 58 that have planar surfaces substantially in contact with the end faces 46 and 47 of the light guide plate 44. Since the guide portions 58 and the bottom portion 57 of the backlight support bracket 56, facing the light guide plate 44, have a sufficiently high light reflectance, light from the fluorescent tube 50 is reflected therefrom at a high efficiency. The backlight support bracket 56 is integrally formed with the reflector 60.

FIG. 3 is a plan view diagrammatically showing the first panel substrate 20 viewed from the front of the panel and seen through the display electrodes 22, etc. FIG. 4 is a plan view diagrammatically showing the second panel substrate 30 vied from the front. With the liquid-crystal panel 14 viewed from the display screen side as shown in FIG. 1, the second panel substrate 30 shown in FIG. 4 is laminated behind the first panel substrate 20 shown in FIG. 3. In the laminated state thereof, the overextension 38 of the second panel substrate 30 outwardly overextends over from the first panel substrate 20. The cross-sectional view of the liquid crystal shown in FIG. 2 is taken along line S—S shown in FIG. 3 and FIG. 4.

Referring to FIG. 3, the first panel substrate 20 includes the display electrodes 22 formed as a predetermined pattern on the substrate 21, and the wirings 24 to which the display electrodes 22 respectively lead. The display electrodes 22 function as scanning electrodes or signal electrodes. The ends of the wirings 24 are formed as pads 25 serving as terminals to be connected to the conductive members 26 (see FIG. 2).

Referring to FIG. 4, the second panel substrate 30 includes the display electrodes 32, the wirings 34, and the wirings 36. The plurality of display electrodes 32 run in parallel in a predetermined pattern on the substrate 31. The display electrodes 32 function as the others of the scanning electrodes and the signal electrodes. The wirings 34 are continuous from the respective display electrodes 32, and are routed along the peripheral portion of the substrate 31. The wirings 34 run toward the overextension 38 of the second panel substrate 30 and are terminated at the terminals 39 there. The overextension 38 outwardly extends over from the opposed first panel substrate 20 in a plan view.

The ends 37 of the wirings 36 are formed in pads that serve as connection terminals to be connected to the conductive members 26. The conductive members 26 electrically respectively connect the pads 37 to the pads 25 as the connection terminals at the ends of the wirings 24 formed on the first panel substrate 20. The conductive members 26 are conductive particles mixed into the sealing member 19 as shown in FIG. 2. The wirings 36 also extend into the overextension 38, thereby forming the terminals 39 at the other ends thereof.

The terminals 39 are formed as parts of the wirings 34 and 36, and are electrically connected to the corresponding display electrodes 22 and 32. The display electrodes 22 on the first panel substrate 20 are connected to the corresponding terminals 39 via the wirings 24 formed on the first panel substrate 20, the conductive members 26, and the wirings 36 formed on the second panel substrate 30.

Referring to FIG. 3, the display electrodes 22 on the substrate 21 are coated with an alignment layer (not shown), fabricated of polyimide, for example. The alignment layer is then subjected to a rubbing process in a predetermined direction. Referring to FIG. 4, the display electrodes 32 on the substrate 31 are coated with an alignment layer (not show) fabricated of polyimide, for example. The alignment layer is subjected to a rubbing process in a predetermined direction.

FIG. 5 is an enlarged plan view diagrammatically showing a single display electrode 32 on the second panel substrate 30 and a wring 34 extending continuously from the display electrode 32. FIG. 6(A) is a diagrammatical cross-sectional view of the wiring 34 taken along line F—F in FIG. 5, and FIG. 6(B) is a diagrammatical cross-sectional view of the display electrode 32 taken along line G—G in FIG. 5.

Referring to FIG. 5, the hatched regions 72 of display electrode 32 and the wiring 34 indicate a metal layer such as of aluminum, having a low electrical resistance. The region 70 of the display electrode 32 indicates a transparent conductive layer such as ITO (Indium Tin Oxide).

Referring to FIGS. 6(A) and 6(B), each of the wiring 34 and the display electrode 32 is formed of a laminated structure of the transparent conductive layer 70 and the metal layer 72 having an electrical resistance lower than that of the transparent conductive layer 70. In the display electrode 32, the transparent conductive layer 70 extends to its full width, while the metal layer 72 runs along one edge portion of the transparent conductive layer 70 and is much narrower in width than the transparent conductive layer 70.

On the other hand, both the transparent conductive layer 70 and the metal layer 72 are coextensive in width with the wiring 34, and have thus substantially the same width. In this way, the electrical resistance of the wiring 34 having a width thereacross substantially narrower than that of the display electrode 32 is made substantially small. The wirings 36 formed on the second panel substrate 30, although not shown, have a construction similar to that of the wiring 34 shown in FIG. 6(A). In other words, the transparent conductive layer 70 and the metal layer 72 are laminated in substantially the same width.

The wirings 24 and the display electrodes 22 formed on the first panel substrate 20 shown in FIG. 3, opposed to the second panel substrate 30 shown in FIG. 4, may have a laminated structure of the transparent conductive layer 70 fabricated of ITO and the metal layer 72 fabricated of aluminum in the same way as in the wirings 34 and the display electrodes 32 shown in FIG. 5 and FIGS. 6(A) and 6(B).

In the display device substrate formed of the first panel substrate 20 and the second panel substrate 30 in this embodiment as discussed above, each of the wiring 24 shown in FIG. 3 and the wirings 34 and 36 shown in FIG. 4 has the laminated structure of the transparent conductive layer 70 and the metal layer 72. Compared with the case in which the wirings 24, 34, and 36 are formed only by the transparent conductive layer 70 only, the electrical resistance of the wirings 24, 34, and 36 is low. The liquid-crystal display device 10 employing the panel substrates 20 and 30 in this embodiment suffers less from an image quality degradation attributed to a voltage drop through the wirings 24, 34, and 36.

Since there is no need for thickening the transparent conductive layer 70 for the purpose of reducing the electrical resistance of the display electrodes 22 and 23, the light transmittance ratio of the display electrodes 22 and 23 is increased. Although the transparent conductive layer 70 has a full width in the electrodes 22 and 23, the metal layer 72 is substantially narrower than the width of the transparent conductive layer 70. The electrical resistance of the display electrodes 22 and 32 is thus reduced without any substantial drop in the brightness level of the display caused by the presence of the metal layer 72.

Since the length of each wiring 24 is short in the first panel substrate 20 shown in FIG. 3, the wirings 24 and the display electrodes 22 may be manufactured of the conductive transparent ITO layer 70 only. Because of their short lengths, the wirings 36 shown in FIG. 4 may also be manufactured of the conductive transparent ITO layer 70 only.

Referring to FIG. 3, the transparent conductive layer 70 forming the display electrodes 22 is typically concurrently produced together with the transparent conductive layer 70 forming the wirings 24. Referring to FIG. 4, the transparent conductive layer 70 forming the display electrodes 32 is typically concurrently produced with the transparent conductive layer 70 forming the wirings 34 and the wirings 36. Because of their bilayer structure of the transparent conductive layer 70 and the metal layer 72 in this embodiment, the wirings 24, 34, and 36 require no thin design in the transparent conductive layer 70 for a smaller electrical resistance. The transparent conductive layer 70 of the display electrodes 22, which is concurrently produced with the transparent conductive layer 70 of the wirings 24, does not need too much thickness. The display electrodes 32, which are concurrently produced with the transparent conductive layer 70 of the wirings 34 and wirings 36, do not need too much thickness. The light transmittance ratio of the display electrodes 22 shown in FIG. 3 and the display electrodes 32 shown in FIG. 4 can be higher compared with the case in which the electrical resistance of the wirings 24, 34, and 36 is reduced only by thickening the transparent conductive layer 70.

In the liquid-crystal device substrate of this embodiment, the transparent conductive layer 70 used in the display electrodes 22 and the wiring 24 shown in FIG. 3 is thin, compared with the case in which the electrical resistance of the transparent conductive layer 70 used in the wirings 24 shown in FIG. 3 and the wirings 34 and 36 shown in FIG. 4 is reduced only by thickening the transparent conductive layer 70. Further, the transparent conductive layer 70 used in the display electrodes 32 and the wirings 34 and 36 shown in FIG. 4 is thinned. For this reason, the time required to produce the panel substrates 20 and 30 is shortened accordingly.

The manufacturing method for manufacturing the first panel substrate 20 shown in FIG. 3 and the second panel substrate 30 shown in FIG. 4 is now discussed, referring to the embodiments.

The display electrodes and the wirings in the first panel substrate 20 and the second panel substrate 30, produced by laminating the transparent conductive layer and the metal layer, are manufactured through an transparent conductive layer fabrication step, a metal layer formation step, a first photoresist film formation step, a first etching step, a second photoresist film formation step, and a second etching step.

FIGS. 7(A)–7(E) are diagrammatic cross-sectional views illustrating the manufacturing process of the second panel substrate 30. FIG. 7(A) illustrates the transparent conductive layer fabrication step and the metal layer formation step, FIG. 7(B) illustrates the first photoresist film formation step, FIG. 7(C) illustrates the first etching step, FIG. 7(D) illustrates the second photoresist film formation step, and FIG. 7(E) illustrates the second etching step. FIGS. 7(A)–7(E) show the manufacturing process of the display electrodes 32 on the left portions thereof, and the manufacturing process of the wirings 34 on the right portion thereof. Although a single display electrode 32 and a single wiring 34 are shown here, a number of electrodes 32 and wirings 34 are employed in practice.

In the transparent conductive layer fabrication step shown in FIG. 7(A), a transparent conductive layer 70, fabricated of an ITO film, is deposited on the transparent substrate 31 fabricated of a transparent material such as glass. In the metal layer formation step also shown in FIG. 7(A), the metal layer 72 fabricated of aluminum is deposited on the transparent conductive layer 70.

In the first photoresist film formation step shown in FIG. 7(B), a photoresist film is applied on the metal layer 72, and is then subjected to exposure and development processes. A first photoresist film 74, having a predetermined pattern corresponding to the display electrodes 32 and the wirings 34, is thus formed.

In the first etching step shown in FIG. 7(C), the transparent conductive layer 70 and the metal layer 72 are simultaneously etched using the first photoresist film 74, thereby forming the pattern of the display electrodes 32 and the wirings 34 in a plan view.

In the second photoresist film formation step shown in FIG. 7(D), the first photoresist film 74 remaining on the metal layer 72 in the formation region of the display electrodes 32 is then subjected to exposure and development processes. A second photoresist film 76 having a predetermined pattern is formed by removing the photoresist corresponding to the formation area of the transparent conductive layer 70. The photoresist remains in the formation area of the wirings 34 during the formation of the second photoresist film 76.

In the second etching step shown in FIG. 7(E), the second photoresist film 76 is used to partly etch the metal layer 72 corresponding to the display electrodes 32 for patterning. The second etching step is performed at an etch rate different from that of the first etching step so that the metal layer 72 is partly etched with the transparent conductive layer 70 almost unetched.

Finally, the second photoresist film 76 is removed through an ashing process, for example. The wiring 34 shown in FIG. 6(A) and the display electrode 32 shown in FIG. 6(B) thus result.

In accordance with the manufacturing method of the panel substrate of this embodiment, the second photoresist film 76 is formed by subjecting again, to the exposure and development processes, the first photoresist film 74 having the predetermined pattern used in the first etching step shown in FIG. 7(C). Using the second photoresist film 76, the metal layer 72 is partly etched with the part thereof becoming the display electrode 32 left through the second etching step shown in FIG. 7(D). The second photoresist film 76 is then removed. The display electrode 32 composed of the transparent conductive layer 70 and the narrow metal layer 72 is thus obtained.

In the above-referenced steps, a cycle of application and subsequent removal of the photoresist film performed one time only result in the display electrode 32 having the narrow metal layer 72. This process thus substantially reduces the number of steps, compared with the case in which the transparent conductive layer 70 and the metal layer 72 are separately patterned requiring two cycles of application and subsequent removal steps of the photoresist.

In the manufacturing method of the panel substrate of this embodiment, the transparent conductive layer 70 and the metal layer 72 are laminated, and are patterned through one cycle of etching to produce the wiring 34.

The manufacturing method of the panel substrate of the present invention has been discussed in conjunction with the display electrodes 32 and the wirings 34 in the second panel substrate 30. The wirings 36 are also manufactured of the laminated structure of the transparent conductive layer and the metal layer at the same process steps as that for the wirings 34. The display electrodes 22 and the wirings 24 on the first panel substrate 20 shown in FIG. 3 are manufactured in the same manufacturing method as that for the second panel substrate 30, although the patterns of the display electrodes and the wirings are different from those of the counter parts of the second panel substrate 30.

In this embodiment, the metal layer 72 forming the display electrode 32 is arranged on the edge portion of the transparent conductive layer 70 as shown in FIG. 6(B). If no problem arises in the light transmittance ratio of the display electrodes, it is not necessary to locate the metal layer 72 along the edge of the transparent conductive layer 70. For example, the metal layer 72 may be arranged along the center line of the transparent conductive layer 70.

In the first embodiment, the liquid-crystal display device is formed of the transmissive-type panel substrate, i.e., the display device substrate. In contrast, a second embodiment employs a panel substrate having a metal layer with slits formed thereon, instead of one of the two panel substrates, such as the second panel substrate 30. The remaining construction of the second embodiment remains unchanged from that of the first embodiment. The discussion thereof is thus not repeated. As shown, like components are identified with like reference numerals.

FIG. 9 is a plan view diagrammatically showing a second panel substrate 80 used in the second embodiment, and corresponds to FIG. 5 illustrating the first embodiment. FIG. 10 is a cross-sectional view taken along line G—G in FIG. 9, and corresponds to FIG. 6(B) in conjunction with the first embodiment. In this embodiment, the second panel substrate 80 replaces the second panel substrate 30 of the first embodiment, thereby producing a transflective-type liquid-crystal display device.

In the second panel substrate 80, a display electrode 82 is formed of a bilayer structure of a transparent conductive layer 70 and a metal layer 72. A plurality of slits 84 as apertures are formed in the metal layer 72. The metal layer 72 is made of a highly reflective material such as aluminum, copper, silver, or gold. When the slits 84 are arranged in the metal layer 72, the display electrode 82 still has the transparent conductive layer 70 in the slits 84. Regardless of the size of the slits 84, an appropriate electric field is applied in the liquid crystal even in the area of the slits 84.

During a transmissive mode, the transflective-type liquid-crystal device allows illumination light rays to be transmitted through the second panel substrate 80 through the slits 84 opened in the metal layer 72 from behind the second panel substrate 80 and to enter the liquid crystal 18. During a reflective mode, the liquid-crystal device allows light rays to transmit the first panel substrate 20, opposed to the second panel substrate 80, and then the liquid crystal 18, and to be reflected from the surface of the metal layer 72.

Regardless of the transmissive mode or the reflective mode in this embodiment, a voltage is applied to the liquid crystal 18 through the metal layer 72 if the slits 84 are small. When large slits 84 are used, the liquid crystal 18 is driven by the transparent conductive layer 70 in the slits 84, rather than by the metal layer 72.

The liquid-crystal device 10 having the second panel substrate 80 of this embodiment suffers less from an image quality degradation attributed to a voltage drop through the wirings 34 and the display electrodes 82. The wirings 34 and the display electrodes 82 of a bilayer structure of the transparent conductive layer 70 and the metal layer 72 eliminates the need for thickening the transparent conductive layer 70 for the purpose of a small electrical resistance of the wirings 34. There is no need for thickening too much the transparent conductive layer 70 in the display electrode 82, which is typically produced concurrently with the transparent conductive layer 70 of the wirings 34. The light transmittance ratio of the display electrode 82 is thus increased.

Since the transparent conductive layer 70 is made thin in this way, the time required to manufacture the second panel substrate 80 is shortened.

In a way similar to the manufacturing method shown in FIGS. 7(A)–7(E), the display electrode 82 of this embodiment is manufactured through a transparent conductive layer fabrication step, a metal layer formation step, a first photoresist film formation step, a first etching step, a second photoresist film formation step, and a second etching step. After concurrently etching the transparent conductive layer 70 and the metal layer 72 through the first photoresist film 74, the first photoresist film 74 is again subjected to exposure and development processes. The second photoresist film 76 is patterned to etch the metal layer 72 to form the slits 84.

The above-referenced embodiments have been discussed in conjunction with the passive-matrix liquid-crystal display device. Alternatively, the present invention may be applied to an active-matrix liquid-crystal device using a two-terminal switching element such as a TFD. The active-matrix liquid-crystal panel is manufactured of a pair of substrates, i.e., an element substrate and a counter substrate, and a TN-type liquid crystal encapsulated therebetween.

The element substrate includes a plurality of wirings arranged in stripes, TFD arranged for each pixel along each wiring, and a pixel electrode formed of a transparent conductive layer connected to the TFD. The counter substrate opposed to the element substrate includes wide display electrodes running in stripes and intersecting the pixel electrodes on the element substrate in a plan view.

The element substrate and the counter substrate are assembled with the pixel electrodes on the element substrate being opposed to the display electrodes on the counter substrate. A liquid crystal is encapsulated between the two substrates. In this liquid-crystal device, one of the wiring on the element substrate and the display electrode on the counter substrate works as a scanning electrode, and the other of the wiring and the display electrode works as a signal electrode.

In the active-matrix TFD liquid-crystal device thus constructed, the wirings formed on the display substrate as the counter substrate are produced of the laminated structure of the transparent conductive layer and the metal layer in accordance with the present invention. The liquid-crystal device thus provides the same advantages as those of the preceding embodiments.

The active-matrix TFD liquid-crystal device is now discussed, referring to FIG. 12.

FIG. 12 shows a major portion of the active-matrix TFD liquid-crystal device employing the display device substrate of the present invention, particularly, several pixels of the device in enlargement. The general construction of the liquid-crystal device 1 is shown in FIG. 15. The liquid-crystal device 1, employing a TFD (Thin Film Diode) as a two-terminal active element, is a transflective-type liquid-crystal device that selectively uses a reflective display working from natural ambient light and a transmissive display based on an illuminating device. The liquid-crystal device 1 adopts the COG (Chip On Glass) technology which permits liquid-crystal drive ICs to be directly mounted on a substrate.

Referring to FIG. 15, the liquid-crystal device 1 is constructed by gluing a first panel substrate 2a to a second panel substrate 2b with a sealing member 3 interposed therebetween. A gap, i.e., a cell gap, surrounded by the sealing member 3 between the first panel substrate 2a and the second panel substrate 2b, is filled with a liquid crystal. Liquid-crystal drive ICs 4a and 4b are directly mounted on the surface of an overextension 38 of the first panel substrate 2a, outwardly extending over from the second panel substrate 2b. The second panel substrate 2b is an element substrate on which the TFDs are formed. The first panel substrate 2a is a counter substrate that is opposed to the second panel substrate 2b.

Arranged on the second panel substrate 2b in an enclosure surrounded by the sealing member 3 are a plurality of pixel electrodes which runs in the direction of rows XX and in the direction of columns YY in a dot matrix arrangement. Arranged on the first panel substrate 2a in an enclosure surrounded by the sealing member 3 are striped electrodes. The striped electrodes are opposed to the plurality of pixel electrodes on the second panel substrate 2b.

A portion of the liquid crystal interposed between the striped electrode on the first panel substrate 2a and the pixel electrode on the second panel substrate 2b constitutes a single pixel. A plurality of pixels in the enclosure surrounded by the sealing member 3 is placed in a dot matrix arrangement, thereby forming a display area V. The liquid-crystal drive ICs 4a and 4b selectively feed scanning signals and data signals between opposed electrodes of the plurality of pixels, thereby controlling the alignment of the liquid crystal on a pixel by pixel basis. Light rays passing the liquid crystal is modulated by the alignment control of the liquid crystal, displaying characters and numerals on the display area V.

FIG. 12 shows, in enlargement, several of the plurality of pixels constituting the display area V in the liquid-crystal device 1. FIG. 13 is a cross-sectional view of a single pixel.

Referring to FIG. 12, the first panel substrate 2a includes a substrate 6a fabricated of glass or plastics, a light reflector 61 formed on the interior surface of the substrate 6a, a color filter 62 formed on the light reflector 61, and transparent striped display electrodes 63 formed on the color filter 62. As shown in FIG. 13, an alignment layer 71a is formed on the display electrodes 63. The alignment layer 71a is subjected to a rubbing process as one of the orientation processes. The display electrodes 63 are fabricated of an conductive transparent material such as ITO (Indium Tin Oxide).

The second panel substrate 2b opposed to the first panel substrate 2a includes a substrate 6b fabricated of glass or plastics, TFDs (Thin Film Diodes) 67 formed on the interior surface of the substrate 6b as an active element functioning as a switching device, and pixel electrodes 69 respectively connected to the TFDs 67. An alignment layer 71b is formed on the TFDs 67 and the pixel electrodes 69 as shown in FIG. 13. The alignment layer 71b is subjected to a rubbing process. The pixel electrodes 69 are fabricated of an conductive transparent material such as ITO (Indium Tin Oxide).

The color filter 62 of the first panel substrate 2a has color elements 62a of R (red), G (Green), and B (Blue), or C (Cyan), M (Magenta), and Y (Yellow) in locations facing the pixel electrodes 69 of the second panel substrate 2b, while having a black mask 62b in locations not facing the pixel electrodes 69.

Referring to FIG. 13, the gap, i.e., the cell gap between the first panel substrate 2a and the second panel substrate 2b is kept to a constant dimension by spherical spacers 54 dispersed on one of the substrates. The liquid crystal L is then encapsulated into the cell gap.

Referring to FIG. 13 and FIG. 14, each TFD 67 includes a first metal layer 65, an insulator 66 formed on the surface of the first metal layer 65, and a second metal layer 68 formed on the insulator 66. The TFDs 67 have a so-called MIM (Metal Insulator Metal) structure, i.e., the laminated structure of the first metal layer/insulator/second metal layer.

The first metal layer 65 is fabricated of tantalum only, or a tantalum-based alloy. When a tantalum-based alloy is used for the first metal layer 65, an element in the group VI to group VIII in the periodic table, such as tungsten, chromium, molybdenum, rhenium, yttrium, lanthanum, or dysprosium, may be added to tantalum as a base material.

The first metal layer 65 is integrally formed with a first layer 79a of a line wiring 79. The line wirings 79, running in stripes between the pixel electrodes 69, work as a scanning line for supplying the pixel electrode 69 with a scanning signal, or as a data line for supplying the pixel electrode 69 with a data signal.

The insulator 66 is fabricated of tantalum oxide ($Ta_2O_3$) that is obtained by oxidizing the first metal layer 65 through anodizing. When the first metal layer 65 is anodized, the surface of the first layer 79a of the line wiring 79 is also oxidized. Similarly, a second layer 79b fabricated of tantalum oxide is thus formed.

The second metal layer 68 is fabricated of a conductive material such as Cr. The pixel electrode 69 is formed on the substrate 6b in a manner such that the end portion thereof partly overlaps the second metal layer 68. An underlying substrate layer of tantalum oxide may be formed on the surface of the substrate 6b, before the first metal layer 65 and the first layer 79a of the line wiring 79 are formed. The underlying substrate layer is intended to prevent the first metal layer 65 from peeling off as a result of a thermal process subsequent to the deposition of the second metal layer 68, or to prevent an impurity from diffusing into the first metal layer 65.

Referring to FIG. 12, a retardation film 52a is glued onto the exterior surface of the substrate 6a. A polarizer 53a is glued onto the retardation film 52a. A retardation film 52b is glued onto the exterior surface of the substrate 6b. A polarizer 53b is glued onto the retardation film 52b.

If an STN (Super Twisted Nematic) liquid crystal is used, for example, light passing the liquid crystal may be subject to dispersion, causing discoloration to a displayed image. The retardation film 52a and the retardation film 52b are optically anisotropic members to eliminate the discoloration, and may be fabricated of a film that is obtained by uniaxially orienting a resin such as polyvinyl alcohol, polyester, polyether amide, or polyethylene.

The polarizers 53a and 53b are optical film elements having the function of receiving natural ambient light and outputting a linearly polarized light ray. The polarizers 53a and 53b are produced by sandwiching a polarizer layer between TAC (cellulose triacetate) protective layers. The polarizers 53a and 53b are typically arranged with the polarization axes thereof different to each other.

The light reflector 61 is fabricated of a light reflective metal such as aluminum. Apertures 49 for transmitting light are formed at locations corresponding to the pixel electrodes 69 on the second panel substrate 2b, in other words, at locations corresponding to the pixels.

The display electrodes 63 shown in FIG. 12 extend in the YY direction as shown in FIG. 15, forming the wirings 24 and the pads 25 in the overextension 38 as shown in FIG. 16. The pads 25 are electrically connected to the output terminals of the liquid-crystal drive IC 4b mounted on the overextension 38. The wirings 24 have a bilayer structure formed of the transparent conductive layer 70 and the metal layer 72 deposited on the transparent conductive layer 70 as shown in FIG. 6(A). As required, the display electrodes 63 also have a bilayer structure of the transparent conductive layer 70 and the narrow-width metal layer 72 deposited on the transparent conductive layer 70 as shown in FIG. 6(B).

When the liquid-crystal device 1 thus constructed presents a reflective-type display, ambient light entering from the side of a viewer, i.e., from the second panel substrate 2b into the liquid-crystal display device 1 as shown in FIG. 12, is transmitted through the liquid crystal L, reaches the light reflector 61, is reflected therefrom, and returns back into the liquid crystal L. The orientation of the liquid crystal L is controlled by each pixel by a voltage applied between the pixel electrode 69 and the striped display electrode 63, namely, the scanning signal and the data signal. The reflected light fed to the liquid crystal L is modulated by each pixel, thereby presenting characters and numerals to the viewer.

On the other hand, when the liquid-crystal device 1 presents a transmissive-type display, the illumination device mounted external to the first panel substrate 2a, namely, a back light 59 is lit. Light from the back light 59 is transmitted through the polarizer 53a, the retardation film 52a, the substrate 6a, the apertures 49 of the light reflector 61, the color filter 62, the display electrodes 63, and the alignment layer 71a, and then reaches the liquid crystal L. Thereafter, the characters and numerals are then presented in the same way as in the reflective-type display.

As discussed above, in this embodiment, the wirings 24 respectively connected to the display electrodes 63 on the first panel substrate 2a have a bilayer structure of the transparent conductive layer 70 and the metal layer 72 deposited on the transparent conductive layer 70. The electrical resistance of the wirings 24 is thus lower compared with the case in which of the wirings 24 which are formed of the transparent conductive layer 70 only. The liquid-crystal device 1 thus suffers less from an image quality degradation attributed to a voltage drop through the wirings 24.

Since there is no need for thickening the transparent conductive layer 70 to reduce the electrical resistance of the wirings 24, the transparent conductive layer 70 of the display electrodes 63, which is typically produced concurrently with the transparent conductive layer 70 of the wirings 24, does not need too much thickness. The light transmittance ratio of the display electrodes 63 becomes higher compared with the case in which the electrical resistance of the wirings 24 is reduced only by thickening the transparent conductive layer 70.

Since the transparent conductive layer 70 used in the display electrodes 63 and the wirings 24 is made thinner compared with the case in which the electrical resistance of the wirings 24 is reduced only by thickening the transparent conductive layer 70, the time required to form the counter substrate 2a, namely, the display device substrate is shortened.

The present invention may be applied to an active-matrix liquid-crystal device using a three-terminal switching element such as a thin-film transistor (TFT). The active-matrix liquid-crystal panel is manufactured of a pair of substrates, i.e., an element substrate and a counter substrate, and a Twisted-Nematic (TN)-type liquid crystal encapsulated therebetween.

The element substrate includes scanning lines and data lines intersecting the scanning lines, TFTs, each having the gate thereof connected to one scanning line and the source thereof connected to one data line, and conductive transparent pixel electrodes, each connected to the drain of the TFT. The counter substrate opposed to the element substrate includes wide display electrodes, i.e., common electrodes arranged in stripes and overlapping the horizontally arranged pixel electrodes on the element substrate.

The liquid-crystal device AC drives the liquid crystal between the pixel electrode and the display electrode by switching bias voltage level applied to the display electrode on a pixel row by pixel row basis, i.e., every horizontal scanning period and every vertical scanning period. This drive method is hereinafter referred to as a 1 H bias voltage swing drive method.

In the active-matrix TFT liquid-crystal device of the fourth embodiment, the wirings on the display device substrate, namely, the counter substrate, are formed by a laminated structure of a transparent conductive layer and a metal layer. The fourth embodiment thus provides the same advantage as that of the preceding embodiments.

The active-matrix TFT liquid-crystal device is now discussed referring to FIG. 17.

FIG. 17 shows a circuit arrangement of the liquid-crystal device of the fourth embodiment. Arranged in an active matrix area 110 is a matrix of N rows by M columns of pixel TFTs 108. There are also arranged N scanning lines respectively connected to the gate electrodes of the pixel TFTs and M signal lines (=m×n) respectively connected to the sources of the pixel TFTS. Respectively connected to the M signal lines are analog switch TFTs (20-11, 20-12, . . . , 20-nm).

The analog switch TFTs are grouped into n blocks, each block including m adjacent analog switch TFTs. Analog switch TFTs (20-11, 20-12, . . . , 20-1m) constitute a first block, analog switch TFTs (20-21, 20-22, . . . , 20-2m) constitute a second block, . . . , and analog switch TFTs (20-1n, 20-n 2, . . . , 20 nm) constitute an n-th block. The gates of the adjacent analog switches (20-11, 20-12, . . . , 20-1m) in the same block are connected together by a first wiring 22-1. The gates of the analog switch TFTs (20-21, 20-22, . . . , 20-2 m) are connected together by a first wiring 22-2, . . . , and the gates of the analog switch TFTs (20-n1, 20-n 2, . . . , 20-nm) are connected together by a first wiring 22-n.

The sources of analog switch TFTs (20-11, 20-21, . . . 20-n1), which are included different blocks and are not adjacent to each other, are connected together by a second wiring 24-1. Similarly, the sources of the analog switch TFTs (20-12, 20-22, . . . , 20-n2) are connected together by a second wiring 24-2, . . . , and the sources of the analog switch TFTs (20-1m, 20-2 m, . . . , 20-nm) are connected together by a second wiring 24-m.

The analog switch TFTs are divided into n blocks, each block including m TFTs. By controlling the analog switch TFTs in each block by a control signal for on and off switching, the number of signal line terminals is reduced to 1/n. For example, M signal line terminals, if no analog switches are employed, are reduced to m signal line terminals (=M/n). A data driver is connected to m lines of the second wiring 24-1 through 24-m. This arrangement reduces the number of data drivers and the number of terminals, thereby miniaturizing the device and reducing the cost of the device.

In the liquid-crystal device of this embodiment, the amplitude of the input signal supplied to the sources of the analog switch TFTs 20-11, . . . , 20-nm through the second wirings 24-1, . . . , 24-m is preferably 5 V or lower. This arrangement reduces the amount of shift in the threshold voltage of the analog switch TFT, thereby assuring the reliability of the device and increasing image quality.

FIG. 22 plots measurement results of the shift in the threshold voltage of the analog switch TFT and operating time. The gate voltage Vg is 20 V, and the load capacitance C of the liquid crystal is set to be a typical load capacitance in a standard liquid crystal panel, namely, as high as 10 pF. The operating frequency f is set to be 230 kHz.

The liquid-crystal device of this embodiment divides the analog switch TFTs into the n blocks, thereby reducing the number of the data drivers and the number of the terminals. For example, the number of the analog switch TFTs is reduced to 1/n, and the time permitted to charge the pixel electrode is shorter than normal. For this reason, the operating frequency f is set to be higher. Shift characteristics of the threshold value of the TFT in response to a rectangular-wave input signal having an amplitude of 10 V (Vd=10 V) are represented by curve "G", and shift characteristics in response to a rectangular wave input signal having an amplitude of 5 V (Vd=5 V) are represented by "H".

The threshold voltage of the analog switch TFT is shifted by 1 V within an operating time of 200 hours in response to an input signal amplitude of 10 V. When the input signal has an amplitude of 5 V, the shift amount of the threshold voltage is maintained within 1 V for an operating time of 10000 hours.

When the shift amount in the threshold voltage becomes larger than 1 V, an amount of charge written to each electrode pixel in response to data is insufficient. Specifically, the pixel electrode cannot be maintained at a desired voltage, and the contrast of the display is degraded. For example, when the threshold voltage shifts toward the negative side by 1 V with the threshold voltage of the analog switch TFT at 1 V or so, the analog switch TFT is put into a depletion mode. Even with the analog switch TFT in an off state, current is leaked, thereby leading to a degradation in display characteristics.

To increase the reliability of the liquid-crystal device, the shift amount of the threshold voltage must be maintained to within 1 V within at least an operating time of 1000 hours. Preferably, the shift amount of the threshold voltage is maintained to within 1 V for several thousand hours. With Vd=10 V, the shift amount becomes larger than 1 V within an operating time of 200 hours, and reaches 2 V within an operating time of 1000 hours as shown in FIG. 22. This is detrimental to assuring the reliability of the device. Using the input signal with the amplitude thereof not higher than 5 V, the liquid-crystal device of this embodiment alleviates concentration of electric field at the end portion of the source of the analog switch TFT. In this way, the shift amount of the threshold voltage is kept to within 1 V for an operating time of 10000 hours or so, and the reliability of the device is assured with a sufficient safety margin allowed. Further with the amplitude of the input signal not higher than 5 V, the difference between penetration voltages of the analog switch TFTs is reduced. The direct-current voltage applied to the liquid crystal is lowered.

Referring to FIG. 22, the gate voltage of the analog switch TFT is set to be 20 V in the case Vd=5 V to assure proper comparison with the case of Vd=10 V. When the amplitude of the input signal is 5 V, namely, Vd=5 V, writing performance is as good as when the gate voltage Vg is 20 V with Vd=10 V. In this case, the shift amount of the threshold voltage is reduced to be lower than curve "H" shown in FIG. 22, and the reliability of the device is further improved. To further improve the reliability, the input voltage is preferably not higher than 3 V. Curve "I" shown in FIG. 22 represents shift characteristics in response to the input voltage of 5 V at an operating frequency of 32 kHz.

In the liquid-crystal device of this embodiment, the pixel TFT and the analog switch TFT, fabricated of polycrystalline silicon or monocrystalline silicon, are integrally formed on a glass substrate. Display characteristics will be degraded if charging and discharging of a pixel electrode are not completed within a predetermined duration of time when an input signal is applied to an analog switch TFT. For this reason, the on resistance of the analog switch TFT needs to be reduced. When the analog switch TFTs are divided into the n blocks to reduce the number of the data drivers, the requirement for the reduction of the on resistance is even more rigorous. Amorphous silicon TFTs have an extremely low mobility. For their on resistance characteristics, the amorphous silicon TFTs cannot be used for an analog switch TFT even if it can be used for a pixel TFT.

In this embodiment, the pixel TFT and the analog switch TFT are fabricated of polycristal silicon or monocrystal silicon, having a mobility substantially higher than that of the amorphous silicon TFT. This arrangement allows the pixel TFT and the analog switch TFT to be integrally formed on the glass substrate. With the pixel TFT and the analog switch TFT integrally formed on the glass substrate, external dimensions of the liquid-crystal device are miniaturized and the cost thereof is reduced.

FIG. 18 illustrates the manufacturing method for integrally forming the pixel TFT and the analog switch TFT and the structure of the TFTs. An underlying insulator 132 for preventing impurities from diffusing from a glass substrate 130 is deposited on the glass substrate 130. A polycrystalline silicon thin layer 134 is then deposited on the underlying insulator 132. The crystallinity of the polycrystalline silicon thin layer 134 must be improved to increase mobility in response to the field effect. To this end, the polycrystalline silicon thin film is recrystallized using a laser anneal or solid phase epitaxy, or polycrystalline silicon resulting from recrystallizing an amorphous silicon film is used. The polycrystalline silicon thin layer 134 is patterned in islands, and a gate insulator 136 is then deposited thereon.

A gate electrode 138 is formed of a metal, for example. The doping with an impurity such as phosphorus ions is performed over the entire surface of the laminate. An interlayer insulator (SiO$_2$) 140 is then formed. A metal thin layer 142, of aluminum (Al) for example, is deposited for signal lines. A pixel electrode 144 is fabricated of a transparent conductive layer such as of ITO. A passivation layer 146 is then formed. A substrate having the pixel TFT integrated with the analog switch TFT thus results. The substrate is then subjected to an alignment process. A counter substrate 135, which has been similarly subjected to an alignment process, is arranged to be opposed the element substrate with a gap of several μm maintained therebetween. The liquid crystal L is then encapsulated between the substrates. A liquid-crystal device is thus produced.

The counter substrate 135 has a display electrode 22 formed on the surface facing the liquid crystal L as shown in FIG. 3. Terminals from external circuits are connected to the pads 25 of the wiring 24 to which the display electrodes 22 extend. The wirings 24 has a bilayer structure of the transparent conductive layer 70 and the metal layer 72 as shown in FIG. 6(A). As required, the display electrodes 22 also have a bilayer structure of the wide-width transparent conductive layer 70 and the narrow-width metal layer 72 deposited on the transparent conductive layer 70 as shown in FIG. 6(B).

The liquid-crystal device 101 shown in FIG. 17 may be designed in an external configuration shown in FIG. 19, for example. Referring to FIG. 19, a display area, i.e., an active matrix area 160, is shown enclosed by a broken line. The liquid crystal material is interposed between a color filter substrate 162 and a TFT substrate 164. The analog switch TFTs and their associated wirings are arranged on an area 166.

A data driver 170 is mounted using a TAB (Tape Automated Bonding) tape 168. A data driver 172 and a scanning driver 174 are similarly mounted using the TAB tape 168.

A circuit board 176 bears wirings and capacitors for feeding signals to the data drivers 170, and 172, and the scanning driver 174. As required, a control circuit for controlling the data drivers and the scanning driver is arranged on the circuit board 176.

In the embodiment shown in FIG. 19, half of the analog switch TFTs is mounted on the top side of the active matrix area 160, while the other half of the analog switch TFTs is mounted on the underside of the active matrix area 160. The M signal lines shown in FIG. 17 are thus interdigitally arranged from the top side and the bottom side of the active matrix area 160. The data drivers and the scanning driver are mounted on the same sides of the color filter substrate 162 and the TFT substrate 164 forming a liquid-crystal panel. In this way, the dimension L3 of the liquid-crystal device of this embodiment is substantially reduced. The liquid-crystal device suitably finds applications in mobile telephones, mobile electronic terminals, etc.

As discussed above, the amplitude of the input signal to the source of the analog switch TFT is preferably not higher than 5 V to properly control the shift amount of the threshold voltage of the analog switch TFT in the liquid-crystal device 101 of this embodiment. However, the following problem can arise in the standard drive method.

FIG. 21 shows the standard drive method using a field polarity reversal. Since the liquid crystal needs to be driven from an alternating current, a signal Vs applied to the signal line is reversed with respect to a predetermined voltage Vc in polarity every predetermined period. Referring to FIG. 21, the voltage Vs swings in a large amplitude. Since a standard TN liquid crystal needs a voltage of ±5 V, the voltage Vs has an amplitude of 10 V or so. A voltage Vcom applied to the counter electrode is lower than the central voltage Vc of the voltage Vs by ΔV to compensate for a penetration voltage that occurs when the pixel TFT is in an off state. Here, the condition of average ΔV=Vc-Vcom holds.

Referring to a drive voltage waveform diagram shown in FIG. 21, the amplitude of the input signal to the analog switch TFT needs to be as large as 10 V. The amplitude of the input signal to the analog switch TFT also needs to be large. For this reason, the input signal cannot be reduced to an amplitude smaller than 5 V. Accordingly, the present embodiment reverses the polarity of the voltage applied to the counter electrode relative to the input signal every horizontal scanning period as shown in FIG. 20. (This drive method is called a 1 H bias voltage swing drive method.)

Referring to FIG. 21, the polarity of the voltage Vs is reversed with respect to the voltage Vc every field. In the 1 H bias voltage swing drive method, the polarity of the Vcom is reversed every horizontal scanning period. This eliminates the need for the polarity reversal of the voltage Vs. The amplitude of the Vs is thus reduced. For this reason, the input signal to the analog switch TFT can be set to be smaller than 5 V while the display quality of the device is maintained. Since the operating voltage of the data drivers is lowered, the device can be manufactured on a manufacturing process supporting 5 V withstand voltage specifications. The data drivers are thus miniaturized, and reduced in power consumption and costs.

The 1 H bias voltage swing drive method satisfies both the reliability requirement to the analog switch TFT and low operating voltage requirement of the data drivers. Referring to FIG. 20, the condition of average ΔV=average Vs—average Vcom holds to control the adverse effect of penetration voltage.

In this embodiment, as discussed above, the striped display electrodes 22 shown in FIG. 3 are formed on the counter substrate 135 shown in FIG. 18. The wirings 24 leading to the display electrodes 22 have a laminated structure of the transparent conductive layer 70 and the metal layer 72 as shown in FIG. 6(A). The electrical resistance of the wiring 24 is reduced to be lower than when the wirings 24 are fabricated of the transparent conductive layer 70 only. The liquid-crystal device thus suffers less from an image quality degradation attributed to a voltage drop through the wirings 24.

Since there is no need for thickening the transparent conductive layer 70 to reduce the electrical resistance of the wirings 24, the transparent conductive layer 70 of the display electrodes 63, which is typically produced concurrently with the transparent conductive layer 70 of the wirings 24, does not need too much thickness. The light transmittance ratio of the display electrodes 63 becomes higher compared with the case in which the electrical resistance of the wirings 24 is reduced only by thickening the transparent conductive layer 70.

Since the transparent conductive layer 70 used in the display electrodes 63 and the wirings 24 is made thinner compared with the case in which the electrical resistance of the wirings 24 is reduced only by thickening the transparent conductive layer 70, the time required to form the counter substrate 2a, namely, the display device substrate is shortened.

FIGS. 8(A), 8(B), and 8(C) show embodiments of electronic equipment which incorporates one of the liquid-crystal device 10 shown in FIG. 1, the liquid-crystal device 1 shown in FIG. 15, and the liquid-crystal display device 101 shown in FIG. 17. FIG. 8(A) shows a mobile telephone 88 having the liquid-crystal device 10 or the like on the upper portion thereof. FIG. 8(B) shows a wristwatch 92 having the liquid-crystal device 10 or the like as a display section thereof. FIG. 8(C) shows a mobile information terminal 96 having the liquid-crystal device 10 or the like as the display section thereof and an input section 98.

Besides the liquid-crystal device 10, each of the above electronic equipment includes a diversity of circuits including a display information output source 86, a display information processor 87, a clock generator 89, etc., and a display signal generator 93 including a power source circuit 91 for supplying these circuits with power. The mobile information terminal 96 shown in FIG. 8(C) displays, on the display section thereof, an image generated in response to the supply of display signals produced by the display signal generator 93 based on input information from the input section 98.

The electronic equipment incorporating one of the liquid-crystal devices 10 and the like of the above embodiments is not limited to the mobile telephone, the wristwatch, and the mobile information terminal. The electronic equipment may include a notebook computer, an electronic notebook, a pager, a tabletop calculator, a POS terminal, an IC card, a mini-disc player, etc.

The preferred embodiments of the present invention have been discussed. The present invention is not limited to these embodiments. A variety of changes and modifications of these embodiments is possible within the scope of the appended claims.

In the above embodiments, the transparent conductive layer is fabricated of ITO, and the metal layer is fabricated of aluminum. As long as a material forming the transparent conductive layer has a sufficiently high light transmittance and a sufficient conductivity, any material is acceptable. For example, tin oxide or silver may be employed. The transparent conductive layer may be a transflective layer partly reflective and partly transmissive. As long as a material forming the metal layer has a sufficient conductivity, any material is acceptable. For example, chromium, copper, silver, or gold may be acceptable.

The liquid-crystal panel discussed above may include a color filter on the interior surface of one of the substrates, thereby making a color display device. The color filter is preferably formed beneath the display electrode.

In each of the above embodiments, an STN liquid crystal is used for the liquid-crystal panel. The liquid-crystal panel is not limited to this. Employed is any of a variety of liquid-crystal panels of TN (Twisted Nematic) type, guest-host type, phase transition type, bistable TN (Twisted Nematic) type, and ferroelectric type. The display electrode is not limited to a striped configuration. The display electrode may have a character such as an icon.

A transmissive-type liquid-crystal device is shown in the embodiment in FIG. 1. The present invention is applicable to a reflective-type display device. Such a liquid-crystal device employs a reflector behind the substrate or a reflective electrode as one of the display electrode, instead of a back light unit.

The present invention is not limited to any of the above embodiments. A variety of changes, modifications and equivalents are possible within the scope of the present invention.

As discussed above, the present invention includes a wiring having a laminated structure of a transparent conductive layer and a metal layer. The electrical resistance of the wiring is lower than when the wiring is constructed of the transparent conductive layer only. A liquid-crystal device incorporating the display device substrate of this invention suffers less from image quality degradation attributed to a voltage drop across the wiring.

Since there is no need for thickening the transparent conductive layer to reduce the electrical resistance of the wirings, the transparent conductive layer of the display electrodes, which is typically produced concurrently with the transparent conductive layer of the wirings, does not need too much thickness. The light transmittance ratio of the display electrodes becomes higher compared with the case in which the electrical resistance of the wirings is reduced only by thickening the transparent conductive layer.

Since the transparent conductive layer used in the display electrodes and the wirings is made thinner compared with the case in which the electrical resistance of the wirings is reduced only by thickening the transparent conductive layer, the time required to form the counter substrate, namely, the display device substrate is shortened.

What is claimed is:

1. A display device substrate comprising:
a plurality of display electrodes;
a plurality of wirings for applying the plurality of display electrodes with a voltage;
the plurality of wirings including a laminated structure composed of a transparent conductive layer formed of the same layer as that of the display electrodes, and a metal layer having an electrical resistance lower than that of the transparent conductive layer;
the display electrodes including the laminated structure of the transparent conductive layer and the metal layer; and
a reflective display function using the region of the metal layer as a light reflective section.

2. The display device substrate according to claim 1, wherein the display electrode comprises a laminated structure composed of a transparent conductive layer, and a metal layer having an electrical resistance lower than that of the transparent conductive layer.

3. The display device substrate according to claim 2, wherein the metal layer in the display electrode is narrower in width than the transparent conductive layer.

4. The display device substrate according to claim 1, wherein the metal layer of the display electrodes has an aperture in the laminated structure, and further includes a transmissive display function using the aperture of the metal layer as a light transmissive section.

5. The display device substrate according to claim 1, wherein the wirings are routed from the ends of the respective display electrodes along the peripheral portion of the display device substrate.

6. A liquid-crystal device encapsulating a liquid crystal between a pair of substrates, the device comprising the display device substrate according to claim 1, as to at least one of the pair of substrates.

7. A liquid-crystal device comprising the display device substrate according to claim 4; a counter substrate opposed to the display device substrate; and a liquid-crystal layer encapsulated between the display device substrate and the counter substrate.

8. Electronic equipment comprising:
the liquid-crystal device according to claim 7, as display means.

9. A liquid-crystal device comprising:
a pair of display device substrates;
a liquid crystal encapsulated between the display device substrates;

one of the pair of display device substrates including a plurality of pixel electrodes, and a plurality of two-terminal-type switching elements, each connected to the respective pixel electrode;

the other of the pair of display device substrates including a plurality of display electrodes arranged in stripes to be opposed to the plurality of pixel electrodes, and wirings respectively connected to the display electrodes, the plurality of display electrodes including a transparent conductive layer;

the wirings including a transparent conductive layer formed of the same layer as that of the display electrodes, and a metal layer having an electrical resistance lower than that of the transparent conductive layer;

the display electrodes including the laminated structure of the transparent conductive layer and the metal layer; and a reflective display function using the region of the metal layer as a light reflective section.

10. A liquid-crystal device comprising:

a pair of display device substrates;

a liquid crystal encapsulated between the display device substrates;

one of the pair of display device substrates including a plurality of pixel electrodes, and a plurality of three-terminal-type switching elements, each connected to the respective pixel electrode; and the other of the pair of display device substrates including a plurality of display electrodes arranged in stripes to be opposed to the plurality of pixel electrodes, and wirings respectively connected to the display electrodes, the plurality of display electrodes including a transparent conductive layer;

the wirings including a transparent conductive layer formed of the same layer as that of the display electrodes, and a metal layer having an electrical resistance lower than that of the transparent conductive layer;

the display electrodes including the laminated structure of the transparent conductive layer and the metal layer; and a reflective display function using the region of the metal layer as a light reflective section.

* * * * *